US012640112B2

(12) United States Patent
Chen et al.

(10) Patent No.: US 12,640,112 B2
(45) Date of Patent: May 26, 2026

(54) GATE DRIVING CIRCUIT AND DISPLAY DEVICE

(71) Applicant: HannStar Display Corporation, Taipei City (TW)

(72) Inventors: Jing-Xuan Chen, Taipei City (TW); Cheng-Yen Yeh, Taipei City (TW); Yen-Chung Chen, Taipei City (TW); Mu-Kai Kang, Taipei City (TW); Qi-En Luo, Taipei City (TW); Shao-Chien Chang, Taipei City (TW)

(73) Assignee: HannStar Display Corporation, Taipei City (TW)

( * ) Notice: Subject to any disclaimer, the term of this patent is extended or adjusted under 35 U.S.C. 154(b) by 5 days.

(21) Appl. No.: 18/928,218

(22) Filed: Oct. 28, 2024

(65) Prior Publication Data

US 2025/0218412 A1 Jul. 3, 2025

(30) Foreign Application Priority Data

Dec. 28, 2023 (TW) .................................. 112151318

(51) Int. Cl.
*G09G 3/36* (2006.01)
*G09G 3/3266* (2016.01)
*G11C 19/28* (2006.01)

(52) U.S. Cl.
CPC ......... *G09G 3/3677* (2013.01); *G09G 3/3266* (2013.01); *G11C 19/287* (2013.01);
(Continued)

(58) Field of Classification Search
CPC .............. G09G 3/3677; G09G 3/3266; G09G 2310/0286; G09G 2330/021; G11C 19/287; G11C 19/28
See application file for complete search history.

(56) References Cited

U.S. PATENT DOCUMENTS 10,636,356 B1 4/2020 Qian et al.
2015/0270012 A1* 9/2015 Ochiai ................. G09G 3/3674
377/78

(Continued)

FOREIGN PATENT DOCUMENTS

TW 201101274 A1 1/2011

*Primary Examiner* — William Boddie
*Assistant Examiner* — Saifeldin E Elnafia
(74) *Attorney, Agent, or Firm* — CKC & Partners Co., LLC

(57) ABSTRACT

A gate driving circuit includes a first gate driving circuit and a second gate driving circuit. The first driving circuit includes $1^{st}$ to $N^{th}$ first shift registers that are configured to output $1^{st}$ to $N^{th}$ first scan signals to N number of scan lines, respectively. The second driving circuit includes $1^{st}$ to $N^{th}$ second shift registers that are configured to output $1^{st}$ to $N^{th}$ second scan signals to the other N number of scan lines, respectively. The number of transistors in each of the $1^{st}$ to $N^{th}$ second shift registers is less than the number of transistors in each of the $1^{st}$ to $N^{th}$ first shift registers.

9 Claims, 18 Drawing Sheets

(52) U.S. Cl.

CPC ............... *G09G 2310/0286* (2013.01); *G09G 2330/021* (2013.01); *G11C 19/28* (2013.01)

(56) References Cited

U.S. PATENT DOCUMENTS

| | | | |
|---|---|---|---|
| 2018/0075789 A1 | 3/2018 | Wen et al. | |
| 2019/0139474 A1* | 5/2019 | Tsai ......................... | G09G 3/20 |
| 2019/0279574 A1 | 9/2019 | Kim et al. | |
| 2020/0279521 A1* | 9/2020 | Ma ....................... | G09G 3/2092 |
| 2022/0308397 A1* | 9/2022 | Zhang ............... | G02F 1/133606 |
| 2023/0141543 A1 | 5/2023 | Gu et al. | |
| 2023/0154430 A1 | 5/2023 | Tsai | |
| 2025/0078772 A1* | 3/2025 | Huo ....................... | G11C 19/28 |

\* cited by examiner

RSR(i), i=1~(N-1)

RSR(i)

GATE DRIVING CIRCUIT AND DISPLAY DEVICE

RELATED APPLICATIONS

This application claims priority to Taiwan Application Serial Number 112151318 filed Dec. 28, 2023, which is herein incorporated by reference.

BACKGROUND

Field of Invention

The invention relates to a gate driving circuit and a display device, and more particularly to a gate driving circuit for performing a scan operation on a display panel and a display device having the gate driving circuit.

Description of Related Art

Planar display devices, such as liquid crystal display devices or organic light-emitting diode (OLED) display devices, typically have shift registers for controlling the grayscale displayed by each pixel in the display device at the same time. However, the circuit design of the shift registers needs to consider the correctness of the signals outputted at each time point in order to ensure that the image display quality of the display device is maintained. On the other hand, at present there are already many planar display devices with shift registers manufactured directly onto active array substrates, which can effectively reduce the production cost by reducing the number of driving chips and the processes of bonding the driving chips to the display panel. However, the shift registers fabricated onto the active array substrate increases the area of the display device, which is disadvantageous to narrow bezel designs and is also accompanied by a higher level of power consumption.

SUMMARY

The objective of the invention is to provide a gate driving circuit and a display device having the gate driving circuit which can reduce the border width of the display device and/or increase the layout area of the other circuits in the display device and can effectively reduce power consumption.

According to the above objective, the invention provides a gate driving circuit for use in the multiple driving scan lines of a display panel. The gate driving circuit includes a first gate driving circuit and a second gate driving circuit. The first gate driving circuit includes $1^{st}$ to $N^{th}$ stage first shift registers that are configured to respectively output $1^{st}$ to $N^{th}$ stage first scan signals to N number of the scan lines, where N is an integer greater than or equal to 4. The second gate driving circuit includes $1^{st}$ to $N^{th}$ stage second shift registers that are configured to respectively output $1^{st}$ to $N^{th}$ stage second scan signals to the other N number of the scan lines. The number of transistors in each of the $1^{st}$ to $N^{th}$ stage second shift registers is less than the number of transistors in each of the $1^{st}$ to $N^{th}$ stage first shift registers.

In accordance with one embodiment of the invention, each of the $1^{st}$ to $N^{th}$ stage first shift registers has a first width, each of the $1^{st}$ to $N^{th}$ stage second shift registers has a second width, and the first width is greater than the second width.

In accordance with another embodiment of the invention, each of the $1^{st}$ to $N^{th}$ stage second shift registers is configured to receive a first input signal, and the first input signal of an $i^{th}$ stage second shift register of the $1^{st}$ to $N^{th}$ stage second shift registers is a corresponding one of the $1^{st}$ to $N^{th}$ stage first scan signals, where i is an integer greater than or equal to 1 and less than or equal to N.

In accordance with another embodiment of the invention, each of the $1^{st}$ to $N^{th}$ stage second shift registers is configured to further receive a second input signal, the second input signal of a $j^{th}$ stage second shift register of the $1^{st}$ to $(N-1)^{th}$ stage second shift registers is a corresponding one of the $1^{st}$ to $N^{th}$ stage first scan signals, where j is an integer greater than or equal to 1 and less than or equal to (N-1).

In accordance with another embodiment of the invention, the first gate driving circuit further includes a dummy shift register that is configured to receive one of the $1^{st}$ to $N^{th}$ stage first scan signals and output a dummy scan signal, and the second input signal of the $N^{th}$ stage second shift register is the dummy scan signal.

In accordance with another embodiment of the invention, the second gate driving circuit further includes a scan control signal line that is coupled to the $N^{th}$ stage second shift register, and the second input signal of the $N^{th}$ stage second shift register is a scan control signal that is provided by the scan control signal line.

In accordance with another embodiment of the invention, the second gate driving circuit further includes at least one clock signal line, and an $i^{th}$ stage second shift register of the $1^{st}$ to $N^{th}$ stage second shift registers includes a first transistor, a second transistor, and a third transistor, where i is an integer greater than or equal to 1 and less than or equal to N. A first terminal of the first transistor is configured to receive a first voltage signal, a second terminal of the first transistor is coupled to a first node, and a control terminal of the first transistor is configured to receive a first input signal. A first terminal of the second transistor is configured to receive a second voltage signal, a second terminal of the second transistor is coupled to the first node, and a control terminal of the second transistor is configured to receive a second input signal. A first terminal of the third transistor is configured to receive a clock signal that is provided by one of the at least one clock signal line, a second terminal of the third transistor is coupled to a second node and is configured to output an $i^{th}$ stage second scan signal of the $1^{st}$ to $N^{th}$ stage second scan signals, and a control terminal of the second transistor is coupled to the first node.

In accordance with another embodiment of the invention, the $i^{th}$ stage second shift register further includes a fourth transistor, a fifth transistor, a sixth transistor, and seventh transistor. A first terminal of the fourth transistor is configured to receive a first reference voltage, and a control terminal of the fourth transistor is coupled to the first node. A first terminal of the fifth transistor is configured to receive the first reference voltage, a second terminal of the fifth transistor is coupled to the first node, and a control terminal of the fifth transistor is coupled to a second terminal of the fourth transistor. A first terminal of the sixth transistor is configured to receive the first reference voltage, a second terminal of the sixth transistor is coupled to the second node, and a control terminal of the sixth transistor is coupled to the second terminal of the fourth transistor. A first terminal and a control terminal of the seventh transistor is configured to receive a second reference voltage, and a second terminal of the seventh transistor is coupled to the second terminal of the fourth transistor, and the second reference voltage is greater than the first reference voltage.

According to the above objective, the invention further provides a display device which includes a display panel and a gate driving circuit. The display panel has an active area and a peripheral area and includes scan lines in the active area. The gate driving circuit is in the peripheral area and is configured to drive the scan lines of the display panel, which includes a first gate driving circuit and a second gate driving circuit. The first gate driving circuit includes $1^{st}$ to $N^{th}$ stage first shift registers that are configured to respectively output $1^{st}$ to $N^{th}$ stage first scan signals to N number of the scan lines, where N is an integer greater than or equal to 4. The second gate driving circuit includes $1^{st}$ to $N^{th}$ stage second shift registers that are configured to respectively output $1^{st}$ to $N^{th}$ stage second scan signals to the other N number of the scan lines. The number of transistors in each of the $1^{st}$ to $N^{th}$ stage second shift registers is less than the number of transistors in each of the $1^{st}$ to $N^{th}$ stage first shift registers.

In accordance with another embodiment of the invention, the peripheral area includes a first sub-peripheral area and a second sub-peripheral area that are outside two opposite sides of the active area. The first gate driving circuit and the second gate driving circuit are respectively in the first sub-peripheral area and the second sub-peripheral area. Each of the $1^{st}$ to $N^{th}$ stage first shift registers has a first width, each of the $1^{st}$ to $N^{th}$ stage second shift registers has a second width, and the first width is greater than the second width.

The beneficial effect of the invention is at least that, the invention can reduce the border width of the display device and/or increase the layout area of the other circuits in the display device and can effectively reduce power consumption.

BRIEF DESCRIPTION OF THE DRAWINGS

The invention can be more fully understood by reading the following detailed descriptions of the exemplary embodiments, with reference made to the accompanying drawings as follows.

DETAILED DESCRIPTION

Specific embodiments of the invention are further described in detail below with reference to the accompanying drawings. However, these exemplary embodiments described are not intended to limit the invention and it is not intended for the description of operation to limit the order of implementation.

Terms used herein are only used to describe the specific embodiments, which are not used to limit the claims appended herewith. Unless the context clearly dictates otherwise and/or otherwise limited, the term "a," "an," or "the" of the singular form may also include plural reference.

It will be understood that, although the terms "first," "second," etc., may be used herein to describe various features, these features should not be limited by these terms. These terms are only used to distinguish a feature from another feature.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
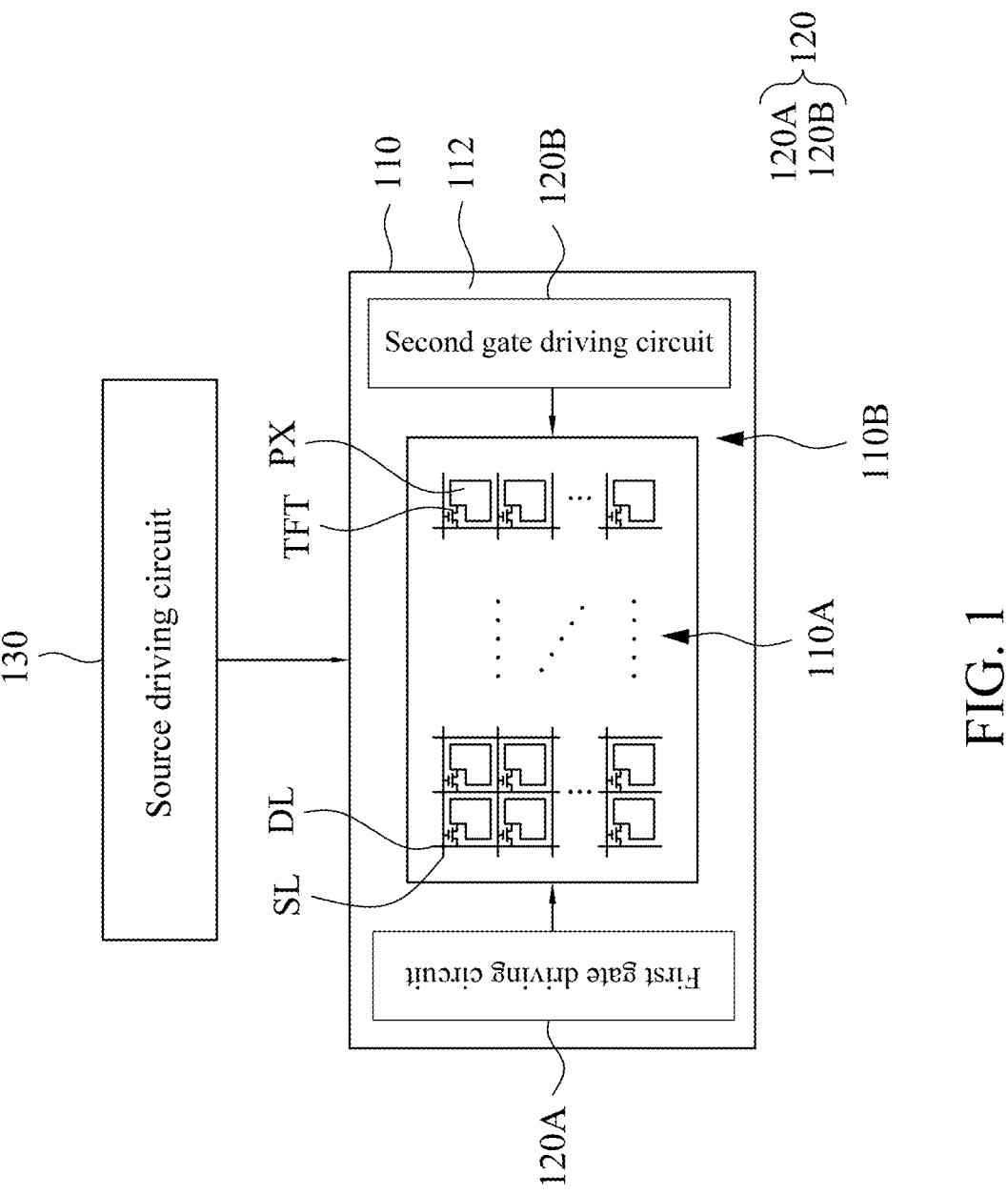
FIG. 1 is a schematic diagram of a display device in accordance with various embodiments of the invention.

FIG. 1 is a schematic diagram of a display device 100 in accordance with various embodiments of the invention. The display device 100 includes a display panel 110, a gate driving circuit 120 and a source driving circuit 130. The display panel 110 may be a liquid crystal display panel of various types, such as twisted nematic (TN), in-plane switching (IPS), fringe-field switching (FFS), or vertical alignment (VA), or may be an organic light-emitting diode (OLED) display panel, a mini light-emitting diode (mini LED) display panel, a quantum dot LED (QDLED) display panel, or another suitable display panel. The display panel 110 includes an active array substrate 112, and the active array substrate 112 includes data lines DL, scan lines SL, and pixels PX. The gate driving circuit 120 includes a first gate driving circuit 120A and a second gate driving circuit 120B. The first gate driving circuit 120A and the second gate driving circuit 120B are arranged respectively at opposite sides of the display panel 110, are all electrically connected to the display panel 110, and are configured to respectively generate and transmit scan signals to the scan lines SL of the display panel 110. The source driving circuit 130 is electrically connected to the display panel 110 and is configured to convert the image data into source driving signals and transmit the source driving signals to the data lines DL of the display panel 110.

The display panel 110 has an active area 110A and a peripheral area 110B. The data lines DL, the scan lines SL, and the pixels PX are in the active area 110A, and the transistor TFT of each pixel PX is electrically connected to the corresponding scan line SL and data line DL. The pixels PX are driven by the source driving signals and the scan signals to display an image, and the first gate driving circuit 120A and the second gate driving circuit 120B are in the peripheral area 110B that has wirings (not shown) respectively coupled to the first gate driving circuit 120A, the second gate driving circuit 120B, and the source driving circuit 130 and respectively coupled to the data lines DL and the scan lines SL in the active area 110A, so as to send the source driving signals and the scan signals respectively to the transistors TFT located at the corresponding pixels PX, such that the pixels PX are controlled by switching of the transistors TFT to display corresponding gray scales at a specific time.

The display device 100 of the invention may be a system on glass (SOG) panel. In the invention, the first gate driving circuit 120A and the second gate driving circuit 120B are formed in the display panel 110; that is, the active array substrate 112 of the display panel 110 includes the first gate driving circuit 120A and the second gate driving circuit 120B. As such, the electronic components in the display panel 110, the first gate driving circuit 120A, and the second gate driving circuit 120B may be simultaneously formed by the same process. For example, the transistors in the first gate driving circuit 120A and the second gate driving circuit 120B may be simultaneously formed by the same process as the transistors TFT in the active area 110A of the display panel 110. In some embodiments, the source driving circuit 130 may also be formed in the peripheral area 110B of the display panel 110, and the electronic components and wirings in the display panel 110, the first gate driving circuit 120A, the second gate driving circuit 120B, and the source driving circuit 130 may be simultaneously formed by the same process.

Figure 2:
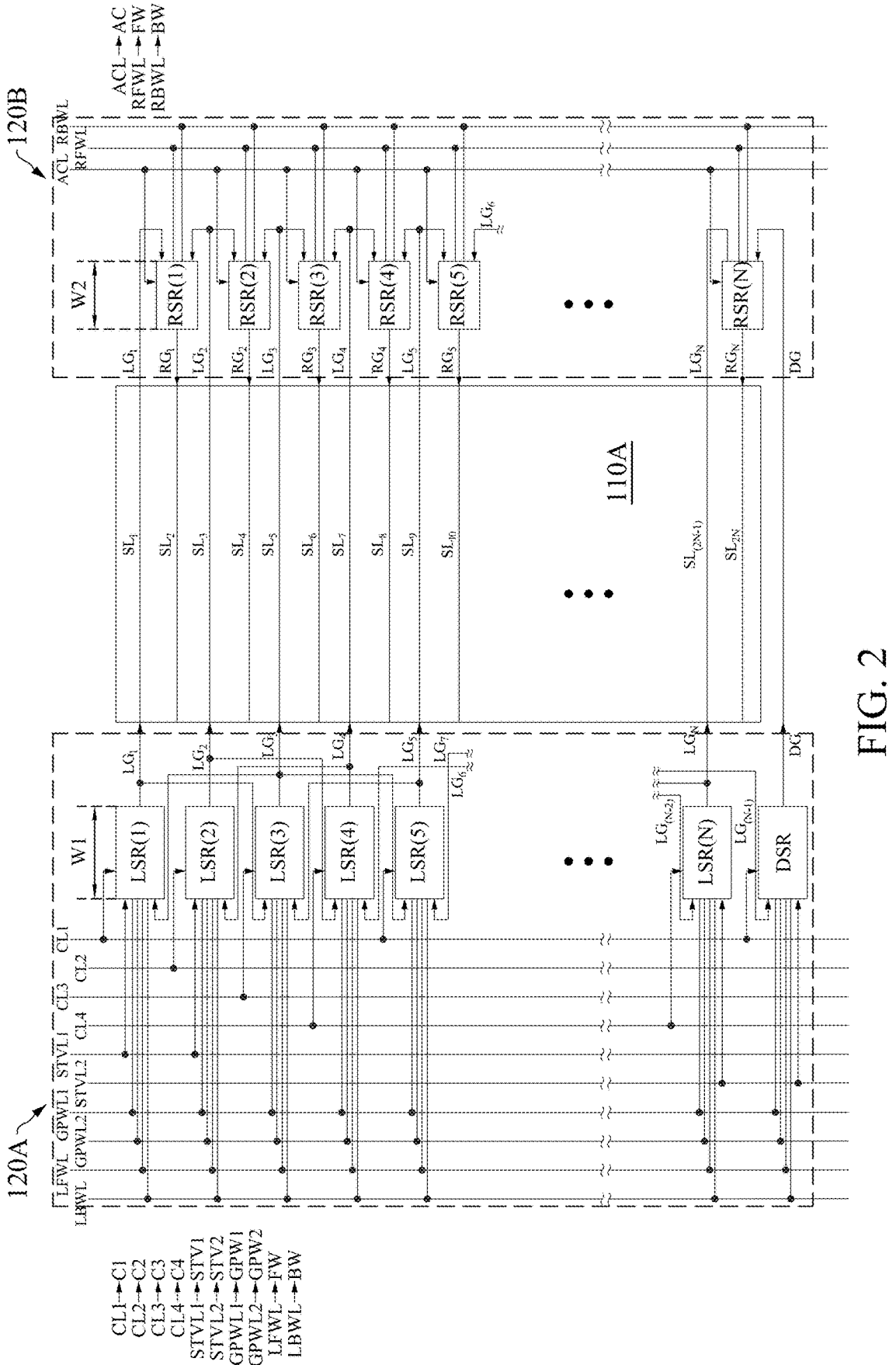
FIG. 2 is a schematic simplified circuit diagram of the active area 110A, the first gate driving circuit 120A, and the second gate driving circuit 120B in FIG. 1 in accordance with the first embodiment of the invention.

FIG. 2 is a schematic simplified circuit diagram of the active area 110A, the first gate driving circuit 120A, and the second gate driving circuit 120B in accordance with the first embodiment of the invention. In order to make the drawings concise, FIG. 2 omits the data lines DL and the pixels PX in FIG. 1. As shown in FIG. 2, the first gate driving circuit 120A and the second gate driving circuit 120B are in the peripheral area (i.e., the peripheral area 110B of FIG. 1) and respectively at opposite sides of the active area 110A. As shown in FIG. 2, the first gate driving circuit 120A includes $1^{st}$ to $N^{th}$ stage first shift registers LSR(1)-LSR(N), and the second gate driving circuit 120B includes $1^{st}$ to $N^{th}$ stage second shift registers RSR(1)-RSR(N), where N is a positive integer greater than or equal to 4. The display panel 110 includes 2N number of scan lines SL (i.e., scan lines $SL_1$-$SL_{2N}$), the $1^{st}$ to $N^{th}$ stage first shift registers LSR(1)-LSR(N) are configured to provide $1^{st}$ to $N^{th}$ stage first scan signals $LG_1$-$LG_N$ respectively to N number of the 2N number of scan lines SL, and the $1^{st}$ to $N^{th}$ stage second shift registers RSR(1)-RSR(N) are configured to provide $1^{st}$ to $N^{th}$ stage second scan signals $RG_1$-$RG_N$ respectively to the other N number of the 2N number of scan lines SL. Specifically, the $1^{st}$ to $N^{th}$ stage first shift registers LSR(1)-LSR(N) are configured to provide the $1^{st}$ to $N^{th}$ stage first scan signals $LG_1$-$LG_N$ respectively to the odd-numbered stage scan lines (i.e., the scan lines $SL_1$, $SL_3$, . . . , $SL_{(2N-1)}$) in the display panel 110, and the $1^{st}$ to $N^{th}$ stage second shift registers RSR(1)-RSR(N) are configured to provide the $1^{st}$ to $N^{th}$ stage second scan signals $RG_1$-$RG_N$ respectively to the even-numbered stage scan lines (i.e., the scan lines $SL_2$, $SL_4$, . . . , $SL_{2N}$) in the display panel 110. The scan lines $SL_1$, $SL_2$, . . . , $SL_{(2N-1)}$, $SL_{2N}$ may also be referred to as the $1^{st}$ stage scan line, the $2^{nd}$ stage scan line, . . . , the $(2N-1)^{th}$ stage scan line, and the $2N^{th}$ stage scan line, respectively. In the embodiment, the scan lines SL are arranged in one direction, and the odd-numbered scanning lines (i.e., the scan lines $SL_1$, $SL_3$, . . . , $SL_{(2N-1)}$) and the even-numbered scan lines (i.e., the scan lines $SL_2$, $SL_4$, . . . , $SL_{2N}$) of the scan lines SL are alternately arranged along the same direction. In addition, the $1^{st}$ to $N^{th}$ stage first scan signals $LG_1$-$LG_N$ generated by the $1^{st}$ to $N^{th}$ stage first shift registers LSR(1)-LSR(N) may be transmitted to the $1^{st}$ to $N^{th}$ stage second shift registers RSR(1)-RSR(N) as the input signals thereof in addition to transmitting to the odd-numbered stage scan lines in the display panel 110. As shown in FIG. 2, the $1^{st}$ to $N^{th}$ stage first shift registers LSR(1)-LSR(N) may provide the $1^{st}$ to $N^{th}$ stage first scan signals $LG_1$-$LG_N$ to the $1^{st}$ to $N^{th}$ stage second shift registers RSR(1)-RSR(N) through the odd-numbered stage scan lines $SL_1$, $SL_3$, . . . , $SL_{(2N-1)}$, respectively, but the mechanism of transmitting the $1^{st}$ to $N^{th}$ stage first scan signals $LG_1$-$LG_N$ to the $1^{st}$ to $N^{th}$ stage second shift registers RSR(1)-RSR(N) according to the embodiment is not limited thereto. In the embodiment, $1^{st}$ to $N^{th}$ stage first shift registers LSR(1)-LSR(N) and the $1^{st}$ to $N^{th}$ stage second shift registers RSR(1)-RSR(N) may be a gate driver on array (GOA) circuit structure. That is, the active array substrate 112 in FIG. 1 includes the $1^{st}$ to $N^{th}$ stage first shift registers LSR(1)-LSR(N) and the $1^{st}$ to $N^{th}$ stage second shift registers RSR(1)-RSR(N).

In the embodiment, the first gate driving circuit 120A further includes a dummy shift register DSR which is configured to provide a dummy scan signal DG to the $N^{th}$ stage second shift register RSR(N) in the second gate driving circuit 120B as an input signal of the $N^{th}$ stage second shift register RSR(N). In the first gate driving circuit 120A, the $1^{st}$ to $N^{th}$ stage first shift registers LSR(1)-LSR(N) and the dummy shift register DSR are arranged from top to bottom as shown in FIG. 2, and each of the $1^{st}$ to $N^{th}$ stage first shift registers LSR(1)-LSR(N) and the dummy shift register DSR has a width W1. In the second gate driving circuit 120B, the $1^{st}$ to $N^{th}$ stage second shift registers RSR(1)-RSR(N) are arranged from top to bottom as shown in FIG. 2, and each of the $1^{st}$ to $N^{th}$ stage second shift registers RSR(1)-RSR(N) has a width W2 that is less than the width W1. Please refer to the explanations contained hereinafter for the reason and advantage of the width W2 of each second shift register being less than the width W1 of each first shift register.

The first gate driving circuit 120A further includes clock signal lines CL1-CL4, scan control signal lines STVL1 and STVL2, pull-down control signal lines GPWL1 and GPWL2, a forward scan signal line LFWL, and a backward scan signal line LBWL, which are configured to provide clock signals C1-C4, scan control signals STV1 and STV2, pull-down control signals GPW1 and GPW2, a forward scan signal FW, and a backward scan signal BW (see the indication on the left side of FIG. 2, which indicates the signal generated by each signal line of the first gate driving circuit 120A with signal lines, arrows, and signals), respectively. The second gate driving circuit 120B further includes a clock signal line ACL, a forward scan signal line RFWL and a backward scan signal line RBWL, which are configured to provide a clock signal AC, the forward scan signal FW, and the backward scan signal BW (see the indication on the right side of FIG. 2, which indicates the signal generated by each signal line of the second gate driving circuit 120B with signal lines, arrows, and signals), respectively. In FIG. 2, the number of clock signals in the first gate driving circuit 120A is exemplified as, but not limited to, 4 (CL1-CL4). In some embodiments, the number of clock signal lines of the first gate driving circuit 120A may be 2, 6, 8, or another suitable quantity.

In detail, in a case where N is a multiple of 4, the clock signal line CL1 is coupled to the $1^{st}$ stage first shift register LSR(1), the $5^{th}$ stage first shift register LSR(5), . . . , and the (N–3)$^{th}$ stage first shift register LSR(N–3), the clock signal line CL2 is coupled to the $2^{nd}$ stage first shift register LSR(2), the $6^{th}$ stage first shift register LSR(6), . . . , and the (N–2)$^{th}$ stage first shift register LSR(N–2), the clock signal line CL3 is coupled to the $3^{rd}$ stage first shift register LSR(3), the $7^{th}$ stage first shift register LSR(7), . . . , and the (N–1)$^{th}$ stage first shift register LSR(N–1), and the clock signal line CL4 is coupled to the $4^{th}$ stage first shift register LSR(4), the $8^{th}$ stage first shift register LSR(8), . . . , and the N$^{th}$ stage first shift register LSR(N). The $1^{st}$ to N$^{th}$ stage first shift registers LSR(1)-LSR(N) respectively generate and output the $1^{st}$ to N$^{th}$ stage first scan signals to the odd-numbered stage scan lines SL$_1$, SL$_3$, . . . , and SL$_{(2N-1)}$ in sequence according to the clock signals C1-C4. The scan control signal line STVL1 is coupled to a portion of the $1^{st}$ to N$^{th}$ stage first shift registers LSR(1)-LSR(N), and the scan control signal line STVL2 is coupled to another portion of the $1^{st}$ to N$^{th}$ stage first shift registers LSR(1)-LSR(N) and the dummy shift register DSR. The pull-down control signal lines GPWL1 and GPWL2, the forward scan signal line LFWL, and the backward scan signal line LBWL are coupled to each of the $1^{st}$ to N$^{th}$ stage first shift registers LSR(1)-LSR(N). The clock signal line CL1, the scan control signal line STVL2, the pull-down control signal line GPWL1 and GPWL2, the forward scan signal line LFWL, and the backward scan signal line LBWL are also coupled to the dummy shift register DSR. The clock signal line ACL, the forward scan signal line RFWL, and the backward scan signal line RBWL are coupled to each of the $1^{st}$ to N$^{th}$ stage second shift registers RSR(1)-RSR(N).

Figure 3A:
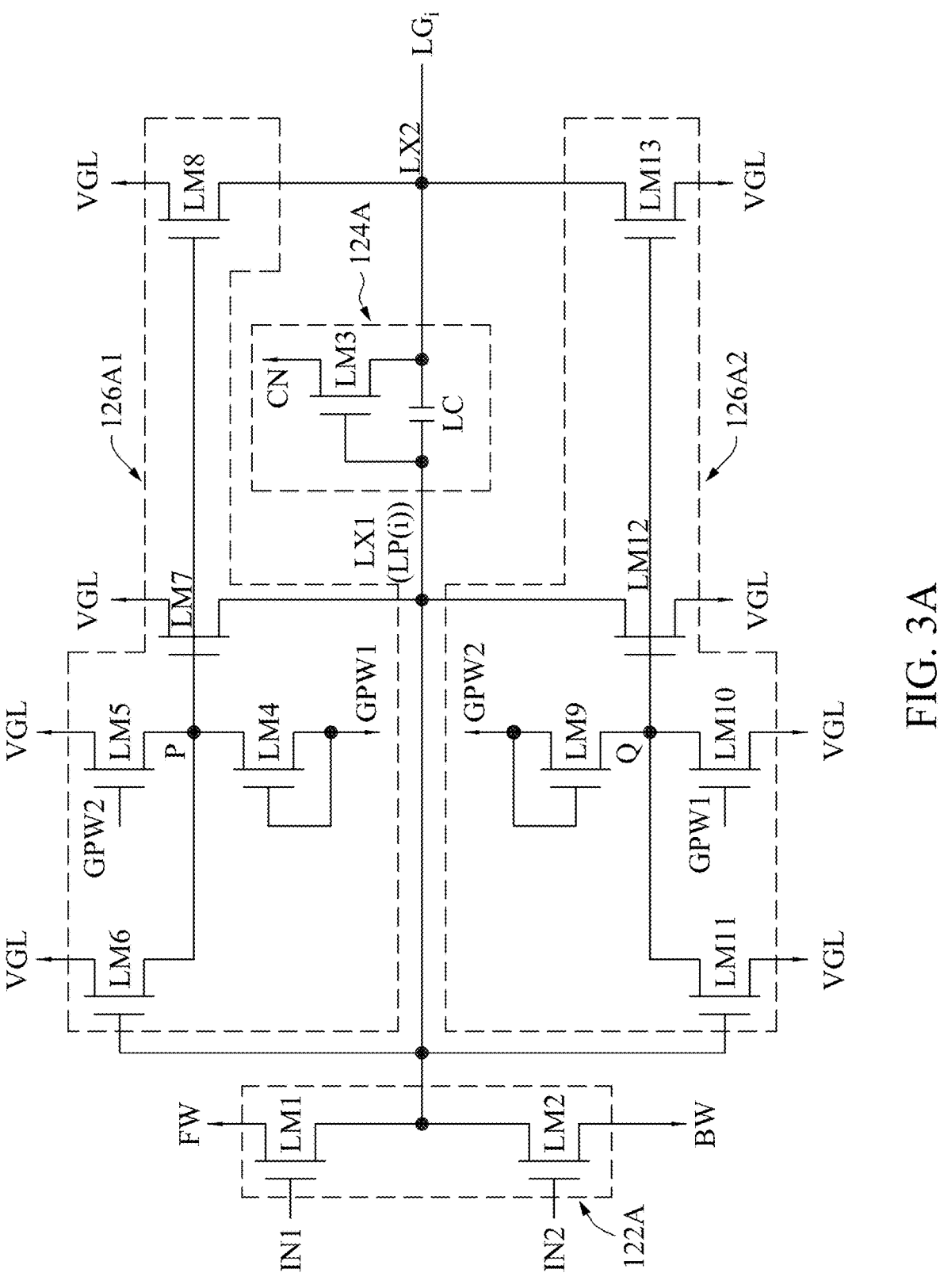
FIG. 3A is an equivalent circuit diagram of the $i^{th}$ stage first shift register in the first gate driving circuit in FIG. 2.

FIG. 3A is an equivalent circuit diagram of the i$^{th}$ stage first shift register LSR(i) in the first gate driving circuit 120A, where i is a positive integer from 1 to N. As shown in FIG. 3A, the i$^{th}$ stage first shift register LSR(i) includes a precharge unit 122A, a pull-up unit 124A, a first pull-down unit 126A1, and a second pull-down unit 126A2, in which the precharge unit 122A is coupled to a node LX1, and each of the pull-up unit 124A, the first pull-down unit 126A1, and the second pull-down unit 126A2 are coupled to the node LX1 and a node LX2. The precharge unit 122A outputs a precharge signal LP(i) to the node LX1 (the label LX1(LP (i)) in FIG. 3A represents the node LX1 has the corresponding precharge signal LP(i)), while the pull-up unit 124A outputs the i$^{th}$ stage first scan signal LG$_i$ to the node LX2. The node LX2 is coupled to the corresponding scan line SL (i.e., the scan line SL$_{(2i-1)}$) of the display panel 110, such that the i$^{th}$ stage first scan signal LG$_i$ is transmitted to the scan line SL$_{(2i-1)}$.

The precharge unit 122A receives input signals IN1 and IN2, a forward scan signal FW, and a backward scan signal BW, and generates and outputs the precharge signal LP(i) to the node LX1 according to the input signals IN1 and IN2, the forward scan signal FW, and the backward scan signal BW. The precharge unit 122A includes transistors LM1 and LM2, in which the control terminals of the transistors LM1 and LM2 are configured to receive the input signals IN1 and IN2, respectively, the first terminals of the transistors LM1 and LM2 are configured to receive a first voltage signal and a second voltage signal, respectively, and the second terminals of the transistors LM1 and LM2 are coupled to the node LX1. In the embodiment, the first gate driving circuit 120A may perform a bi-directional scan (i.e., a forward scan and a backward scan), such that the first voltage signal and the second voltage signal may be, but not limited to, the forward scan signal FW and the backward scan signal BW, respectively. In an embodiment in which the first gate driving circuit 120A can only perform a one-directional scan, the first voltage signal may be a high-voltage signal, and the second voltage signal may be a low-voltage signal, e.g., the first terminal of the transistor LM1 may be coupled to a voltage source to receive a high voltage, and the first terminal of transistor LM2 may be coupled to a ground line or a gate low voltage signal line to receive a low voltage. The input signal IN1 of the i$^{th}$ stage first shift register LSR(i) may be the scan control signal STV1 or the (i–a)$^{th}$ stage first scan signal LG$_{(i-a)}$, where "a" is a positive integer less than 4; and the input signal IN2 of the i$^{th}$ stage first shift register LSR(i) may be the (i+b)$^{th}$ stage first scan signal LG$_{(i+b)}$ or the scan control signal STV2, where b is a positive integer less than 4. Specifically, if i is a positive integer less than or equal to a, the input signals IN1 and IN2 of the i$^{th}$ stage first shift register LSR(i) may be the scan control signal STV1 and the (i+b)$^{th}$ stage first scan signal LG$_{(i+b)}$, respectively; if i is a positive integer from (a+1) to (N–b), the input signals IN1 and IN2 of the i$^{th}$ stage first shift register LSR(i) are the (i–a)$^{th}$ stage first scan signal LG$_{(i-a)}$ and the (i+b)$^{th}$ stage first scan signal LG$_{(i+b)}$, respectively; if i is a positive integer from (N–b+1) to N, the input signals IN1 and IN2 of the i$^{th}$ stage first shift register LSR(i) are the (i–a)$^{th}$ stage first scan signal LG$_{(i-a)}$ and the scan control signal STV2, respectively. In the following description, both a and b are exemplified as 2. If i is 1 or 2, the input signals IN1 and IN2 may be the scan control signal STV1 and the (i+2)$^{th}$ stage first scan signal LG$_{(i+2)}$, respectively (thus the scan control signal line STVL1 in FIG. 2 is coupled to the $2^{nd}$ stage first shift register LSR(2) in addition to the $1^{st}$ stage first shift register LSR(1)); if i is a positive integer from 3 to (N–2), the input signals IN1 and IN2 are the (i–2)$^{th}$ stage first scan signal LG$_{(i-2)}$ and the (i+2)$^{th}$ stage first scan signal LG$_{(i+2)}$, respectively, if i is (N–1) or N, the input signals IN1 and IN2 are the (i–2)$^{th}$ stage first scan signal LG$_{(i-2)}$ and the scan control signal STV2, respectively, and thus the scan control signal line STVL2 is coupled to the (N–1)$^{th}$ stage first shift register LSR(N–1) and the N$^{th}$ stage first shift register. In this context, "the control terminal," "the first terminal," and "the second terminal" of a transistor are the gate, the source, and the drain of the transistor, respectively, or alternatively the gate, the drain, and the source of the transistor, respectively.

The pull-up unit 124A is coupled to the precharge unit 122A (the pull-up unit 124A and the precharge unit 122A are both coupled to the node LX1). The pull-up unit 124A receives the precharge signal LP(i) and a clock signal CN, and outputs the i$^{th}$ stage first scan signal LG$_i$ to the node LX2 according to the precharge signal LP(i) and the clock signal CN, in which the clock signal CN is any one of the clock signals C1-C4. In the embodiment in which N is a multiple of 4, each of the clock signals CN respectively transmitted to the $1^{st}$ stage first shift register LSR(1), the $5^{th}$ stage first shift register LSR(5), . . . , and the (N–3)$^{th}$ stage first shift register LSR(N–3) is the clock signal C1, each of the clock signals CN respectively transmitted to the $2^{nd}$ stage first shift register LSR(2), the $6^{th}$ stage first shift register LSR(6), . . . , and the (N–2)$^{th}$ stage first shift register LSR(N–2) is the clock signal C2, each of the clock signals CN respectively transmitted to the $3^{rd}$ stage first shift register LSR(3), the $7^{th}$ stage first shift register LSR(7), . . . , and the (N−1)$^{th}$ stage first shift register LSR(N−1) is the clock signal C3, and each of the clock signals CN respectively transmitted to the $4^{th}$ stage first shift register LSR(4), the $8^{th}$ stage first shift register LSR(8), . . . , and the N$^{th}$ stage first shift register LSR(N) is the clock signal C4. The pull-up unit 124A includes a transistor LM3 and a capacitor LC. The control terminal of the transistor LM3 is configured to receive the precharge signal LP(i), the first terminal of the transistor LM3 receives the clock signal CN, and the second terminal of the transistor LM3 outputs the i$^{th}$ stage first scan signal LG$_i$. The first terminal of the capacitor LC is coupled to the control terminal of the transistor LM3, and the second terminal of the capacitor LC is coupled to the second terminal of the transistor LM3. In some embodiments, the pull-up unit 124A may be without the capacitive LC.

The first pull-down unit 126A1 is coupled to the precharge unit 122A and the pull-up unit 124A (the first pull-down unit 126A1 is coupled to the nodes LX1 and LX2), and the first pull-down unit 126A1 is enabled or disabled according to the precharge signal LP(i) and the pull-down control signals GPW1 and GPW2. During the image display period, each of the pull-down control signals GPW1 and GPW2 is a signal with alternation between a high voltage and a low voltage, and the pull-down control signals GPW1 and GPW2 are inverted with respect to each other, i.e., one of the pull-down control signals GPW1 and GPW2 is at the high voltage while the other is at the low voltage. The first pull-down unit 126A1 includes transistors LM4-LM8. The control terminal and the first terminal of the transistor LM4 receive the pull-down control signal GPW1. The control terminal of the transistor LM5 receives the pull-down control signal GPW2, the first terminal of the transistor LM5 is coupled to a gate low voltage signal VGL, and the second terminal of transistor LM5 is coupled to the second terminal of transistor LM4 and a node P. The control terminal of the transistor LM6 is coupled to the node LX1, the first terminal of the transistor LM6 is coupled to the gate low voltage signal VGL, and the second terminal of the transistor LM6 is coupled to the second terminal of the transistor LM4. The control terminal of transistor LM7 is coupled to the second terminal of the transistor LM6, the first terminal of transistor LM7 is coupled to the gate low voltage signal VGL, and the second terminal of transistor LM7 is coupled to the node LX1. The control terminal of the transistor LM8 is coupled to the second terminal of the transistor LM6, the first terminal of the transistor LM8 is coupled to the gate low voltage signal VGL, and the second terminal of the transistor LM8 is coupled to the node LX2. When the i$^{th}$ stage first shift register LSR(i) outputs the i$^{th}$ stage first scan signal LG$_i$ to enable the corresponding pixel row, i.e., after the i$^{th}$ stage first scan signal LG$_i$ rises to a high voltage and falls to a low voltage after keeping at the high voltage for a period, the voltage level of the node LX1 falls from a high voltage to a low voltage, and thus the transistor LM6 is turned off, and the first pull-down unit 126A1 is enabled or disabled according to the voltages of the pull-down control signals GPW1 and GPW2. Specifically, when the pull-down control signal GPW1 is at the low voltage and the pull-down control signal GPW2 is at the high voltage, the node P is in a low voltage state, such that that the transistors LM7 and LM8 are turned off (i.e., the first pull-down unit 126A1 is disabled); when the pull-down control signal GPW1 is at the high voltage and the pull-down control signal GPW2 is at the low voltage, the node P is in a high voltage state, such that the transistors LM7 and LM8 are turned on to set the voltage levels of the nodes LX1 and LX2 to the gate low voltage signal VGL (i.e., the first pull-down unit 126A1 is enabled).

The second pull-down unit 126A2 is coupled to the precharge unit 122A and the pull-up unit 124A (the second pull-down unit 126A2 is coupled to the nodes LX1 and LX2), and the second pull-down unit 126A2 is enabled or disabled according to the precharge signal LP(i) and the pull-down control signals GPW1 and GPW2. The second pull-down unit 126A2 includes transistors LM9-LM13. The control terminal and the first terminal of the transistor LM9 receive the pull-down control signal GPW2. The control terminal of the transistor LM10 receives the pull-down control signal GPW1, the first terminal of the transistor LM10 is coupled to the gate low voltage signal VGL, and the second terminal of transistor LM10 is coupled to the second terminal of transistor LM9 and a node Q. The control terminal of the transistor LM11 is coupled to the node LX1, the first terminal of the transistor LM11 is coupled to the gate low voltage signal VGL, and the second terminal of the transistor LM11 is coupled to the second terminal of the transistor LM9. The control terminal of the transistor LM12 is coupled to the second terminal of the transistor LM11, the first terminal of the transistor LM12 is coupled to the gate low voltage signal VGL, and the second terminal of the transistor LM12 is coupled to the node LX1. The control terminal of the transistor LM13 is coupled to the second terminal of the transistor LM11, the first terminal of the transistor LM13 is coupled to the gate low voltage signal VGL, and the second terminal of the transistor LM13 is coupled to the node LX2. When the i$^{th}$ stage first shift register LSR(i) outputs the i$^{th}$ stage first scan signal LG$_i$ to enable the corresponding pixel row, i.e., after the i$^{th}$ stage first scan signal LG$_i$ rises to a high voltage level and falls to a low voltage level after keeping at the high voltage for a period, the voltage level of the node LX1 falls from the high voltage to the low voltage, and thus the transistor LM11 is turned off and the second pull-down unit 126A2 is enabled or disabled according to the voltages of the pull-down control signals GPW1 and GPW2. Specifically, when the pull-down control signal GPW1 is at the low voltage and the pull-down control signal GPW2 is at the high voltage, the node Q is in a high voltage state, such that the transistor LM12 and LM13 are turned on to set the voltage levels of the nodes LX1 and LX2 to the gate low voltage signal VGL (i.e., the second pull-down unit 126A2 is enabled); when the pull-down control signal GPW1 is at the high voltage and the pull-down control signal GPW2 is at the low voltage, the node Q is in a low voltage state, such that the transistors LM12 and LM13 are turned off (i.e., the second pull-down unit 126A2 is disabled). In summary, in a frame period, when the i$^{th}$ stage first shift register LSR(i) outputs the i$^{th}$ stage first scan signal LG$_i$ to enable the corresponding pixel row, i.e., after the i$^{th}$ stage first scan signal LG$_i$ rises to the high voltage level and falls to the low voltage level after keeping at the high voltage for a period, if a noise signal is coupled to the node LX1 and/or LX2, the conducted transistors LM7 and LM8 of the first pull-down unit 126A1 or the conducted transistors LM12 and LM13 of the second pull-down unit 126A2 pull down nodes LX1 and LX2 to a low voltage, i.e., pull down the i$^{th}$ stage first scan signal LG$_i$ and keep the i$^{th}$ stage first scan signal LG$_i$ at a low potential, so that the i$^{th}$ stage first scan signal LG$_i$ is not interfered by noise.

It should be noted that, in the embodiment, the i$^{th}$ stage first shift register LSR(i) includes two pull-down units, and during the image display period, the pull-down control signals GPW1 and GPW2 have periods and the waveforms thereof are inverted with respect to each other, i.e., the waveforms of the pull-down control signals GPW1 and GPW2 change between a high voltage and a low voltage, and when one of the pull-down control signals GPW1 and GPW2 is high, the other is low, such that when one of the first pull-down unit 126A1 and the second pull-down unit 126A2 is enabled, the other is disabled, so as to prevent the transistors in the first pull-down unit 126A1 and the second pull-down unit 126A2 from being turned on for a long time to result in threshold voltage shift that invalidates the first pull-down unit 126A1 and the second pull-down unit 126A2.

Figure 3B:
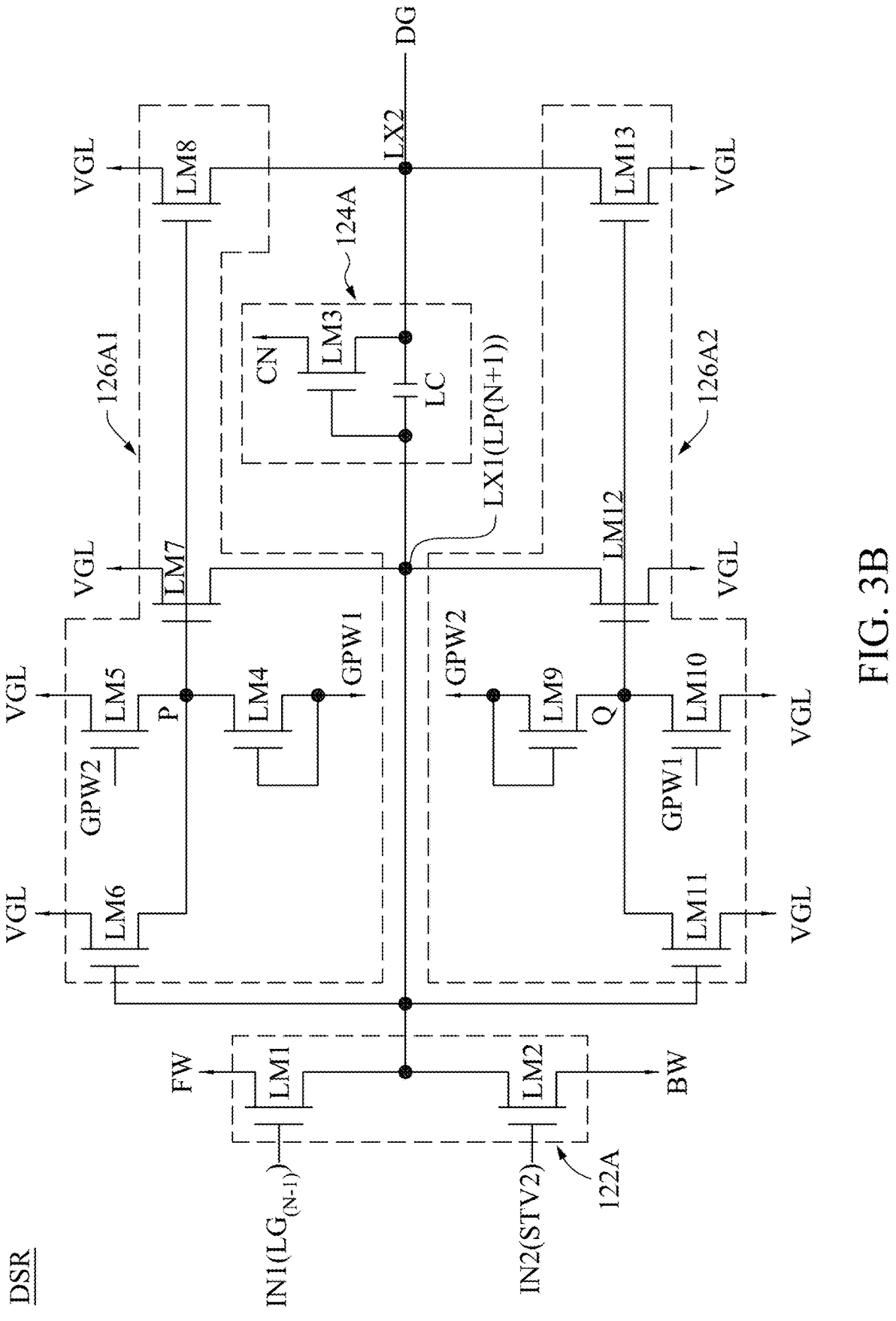
FIG. 3B is an equivalent circuit diagram of the dummy shift register in the first gate driving circuit in FIG. 2.

FIG. 3B is an equivalent circuit diagram of the dummy shift register DSR in the first gate driving circuit 120A. The dummy shift register DSR has the same circuit structure as that of the $i^{th}$ stage first shift register LSR(i) in FIG. 3A. In the dummy shift register DSR, the input signals IN1 and IN2 received by the control terminals of the transistors LM1 and LM2 are the $(N-1)^{th}$ stage first scan signal $LG_{(N-1)}$ and the scan control signal STV2, respectively, the control terminal of the transistor LM3 receives the precharge signal LP(N+1), the first terminal of the transistor LM3 receives the clock signal CN that may be the clock signal C1, and the second terminal of the transistor LM3 outputs the dummy scan signal DG. The remaining features are described in FIG. 3A and are not repeated herein.

Figure 3C:
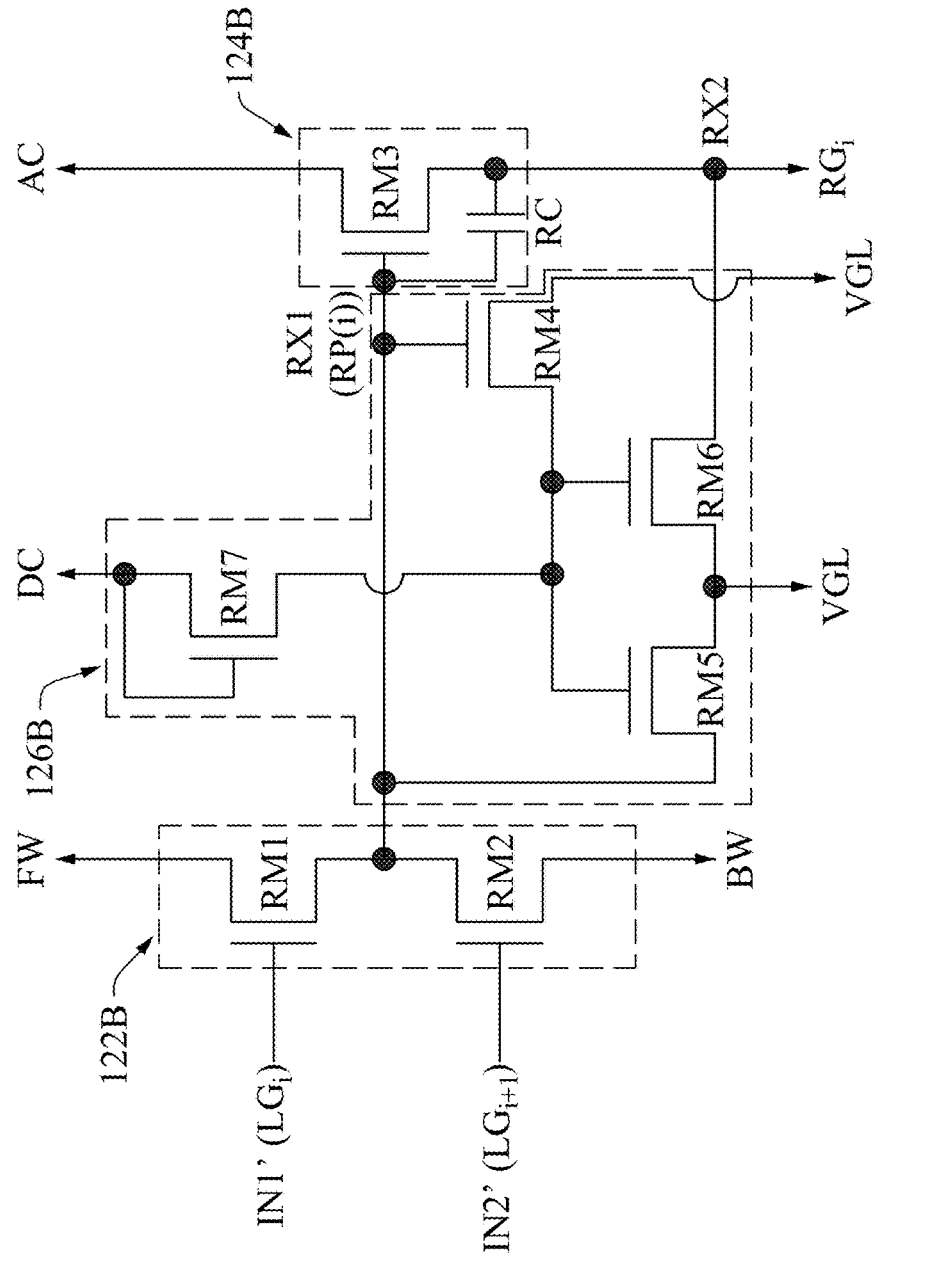
FIG. 3C is an equivalent circuit diagram of the $i^{th}$ stage second shift register in the second gate driving circuit in FIG. 2.

FIG. 3C is an equivalent circuit diagram of the $i^{th}$ stage second shift register RSR(i) in the second gate driving circuit 120B, where i is a positive integer from 1 to (N-1). As shown in FIG. 3C, the $i^{th}$ stage second shift register RSR(i) includes a precharge unit 122B, a pull-up unit 124B and a pull-down unit 126B, in which the precharge unit 122B is coupled to a node RX1, and each of the pull-up unit 124B and the pull-down unit 126B is coupled to the node RX1 and a node RX2. The precharge unit 122B outputs a precharge signal RP(i) to the node RX1 (the label RX1(RP (i)) in FIG. 3C represents the node RX1 has the corresponding precharge signal RP(i)), while the pull-up unit 124B outputs the $i^{th}$ stage second scan signal $RG_i$ to the node RX2. The node RX2 is coupled to the corresponding scan line SL (i.e., the scan line $SL_{(2i)}$) of the display panel 110, such that the $i^{th}$ stage second scan signal $RG_i$ is transmitted to the scan line $SL_{(2i)}$.

The precharge unit 122B receives input signals IN1' and IN2', a forward scan signal FW, and a backward scan signal BW, and generates and outputs the precharge signal RP(i) to the node RX1 according to input signals IN1' and IN2', the forward scan signal FW, and the backward scan signal BW. The input signal IN1' is the $i^{th}$ stage first scan signal $LG_i$ generated by the $i^{th}$ stage first shift register LSR(i) of the first gate driving circuit 120A, and the input signal IN2' is the $(i+1)^{th}$ stage first scan signal $LG_{(i+1)}$ of the $(i+1)^{th}$ stage first shift register LSR(i+1) of the first gate driving circuit 120A. The first terminal of the transistor RM1 is configured to receive a first voltage signal, the second terminal of the transistor RM1 is coupled to the node RX1, and the control terminal of the transistor RM1 is configured to receive the input signal IN1'. The first terminal of the transistor RM2 is configured to receive a second voltage signal, the second terminal of the transistor RM2 is coupled to the node RX1, and the control terminal of the transistor RM2 is configured to receive the input signal IN2'. In the embodiment, the second gate driving circuit 120B may perform a bi-directional scan (i.e., a forward scan and a backward scan), such that the first voltage signal and the second voltage signal may be, but not limited to, the forward scan signal FW and the backward scan signal BW, respectively. In an embodiment in which the second gate driving circuit 120B can only perform a one-directional scan, the first voltage signal may be a high-voltage signal, and the second voltage signal may be a low-voltage signal, e.g., the first terminal of the transistor RM1 may be coupled to a voltage source to receive a high voltage, and the first terminal of transistor RM2 may be coupled to a ground line or a gate low voltage signal line to receive a low voltage.

The pull-up unit 124B is coupled with the precharge unit 122B (the pull-up unit 124B and the precharge unit 122B are both coupled to the node RX1). The pull-up unit 124B receives the precharge signal RP(i) and the clock signal AC, and the pull-up unit 124B outputs the $i^{th}$ stage second scan signal $RG_i$ to the node RX2 according to the precharge signal RP(i) and the clock signal AC. The pull-up unit 124A includes a transistor RM3 and a capacitor RC. The first terminal of the transistor RM3 is configured to receive the clock signal AC, the second terminal of the transistor RM3 is coupled to the coupling node RX2 and is configured to output the $i^{th}$ stage second scan signal $RG_i$, and the control terminal of the transistor RM3 is coupled to the node RX1 and receives the precharge signal RP(i). The first and second terminals of the capacitor RC are coupled to the control terminal and the second terminal of the transistor RM3, respectively. In some embodiments, the pull-up unit 124B may be without the capacitor RC.

The pull-down unit 126B is coupled to the precharge unit 122B and the pull-up unit 124B (the pull-down unit 126B is coupled to the nodes RX1 and RX2). The pull-down unit 126B receives the precharge signal RP(i) and a voltage signal DC, and the precharge signal RP(i) controls whether to enable the pull-down unit 126B. The pull-down unit 126B includes transistors RM4-RM7. The first terminal of the transistor RM4 is configured to receive the gate low voltage signal VGL (also referred to as a first reference voltage), and the control terminal of the transistor RM4 is coupled to the node RX1. The first terminal of the transistor RM5 is configured to receive the gate low voltage signal VGL, the second terminal of the transistor RM5 is coupled to the node RX1, and the control terminal of the transistor RM5 is coupled to the second terminal of the transistor RM4. The first terminal of the transistor RM6 is configured to receive the gate low voltage signal VGL, the second terminal of the transistor RM6 is coupled to the node RX2, and the control terminal of the transistor RM6 is coupled to the second terminal of the transistor RM4. The first terminal and the control terminal of the transistor RM7 are configured to receive the voltage signal DC (also referred to as a second reference potential) of which the voltage level is greater than that of the gate low voltage signal VGL, and the second terminal of the transistor RM7 is coupled to the second terminal of the transistor RM4. When the $i^{th}$ stage second shift register RSR(i) outputs the $i^{th}$ stage second scan signal $RG_i$ to enable the corresponding pixel row, i.e., after the $i^{th}$ stage second scan signal $RG_i$ rises to the high voltage level and falls to the low voltage level after keeping at the high voltage for a period, the voltage level of the node RX1 falls from a high voltage to a low voltage, and thus the pull-down unit 126B is enabled, i.e., the transistor RM4 is turned off, and the transistors RM5 and RM6 are turned on, such that the noise generated at the nodes RX1 and RX2 can be released to the gate low voltage signal VGL through the transistors RM5 and RM6.

Figure 3D:
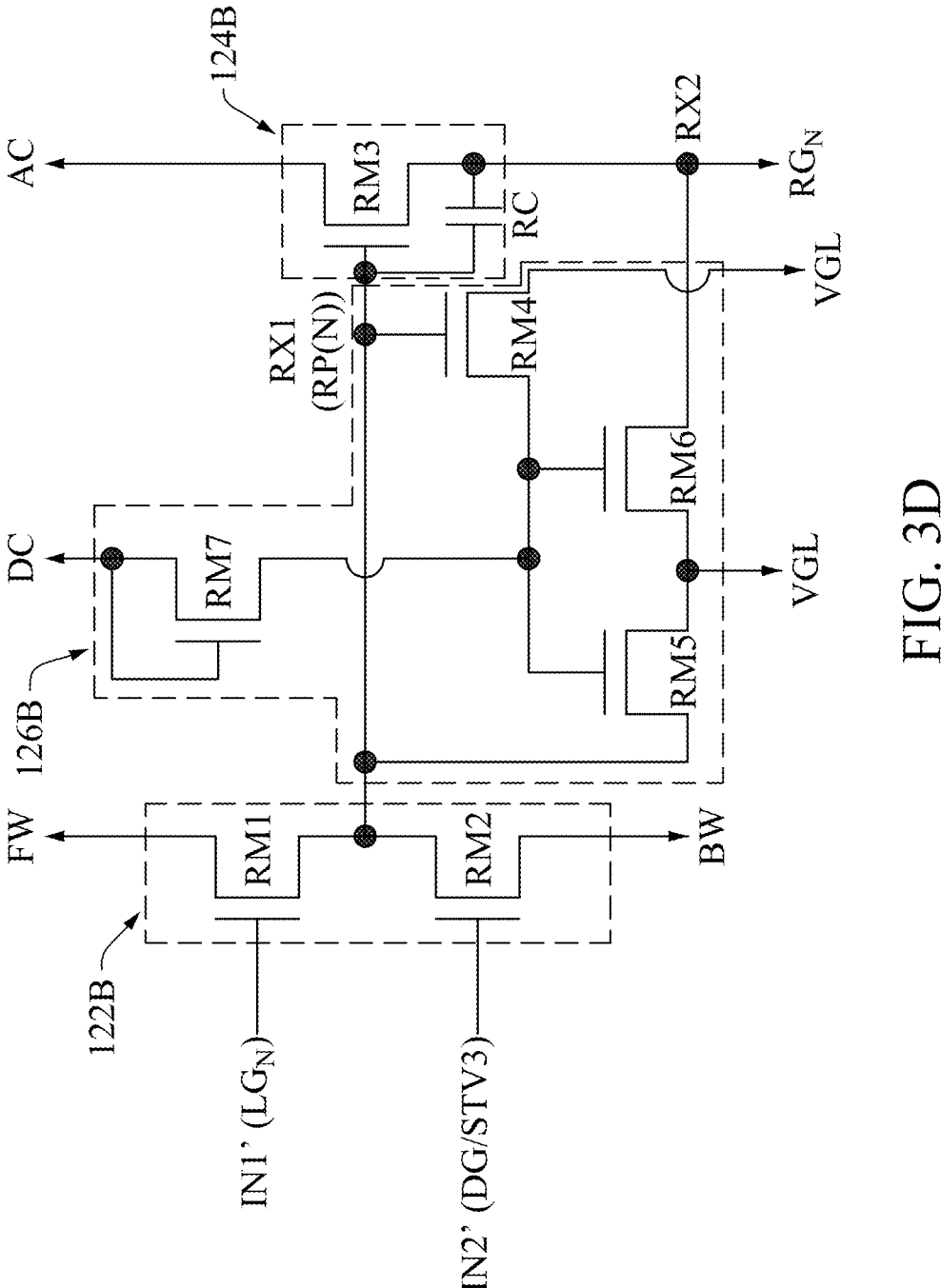
FIG. 3D is an equivalent circuit diagram of the $N^{th}$ stage second shift register in the second gate driving circuit in FIG. 2.

FIG. 3D is an equivalent circuit diagram of the $N^{th}$ stage second shift register RSR(N) in the second gate driving circuit 120B. The $N^{th}$ stage second shift register RSR(N) has the same circuit structure as any of the $1^{st}$ to $(N-1)^{th}$ stage second shift registers RSR(1)-RSR(N−1). In the $N^{th}$ stage second shift register RSR(N), the input signal IN1' is the $N^{th}$ stage first shift signal $LG_N$ generated by the $N^{th}$ stage first shift register LSR(N) of the first gate driving circuit 120A, and the input signal IN2' is the dummy scan signal DG output by the dummy shift register DSR of the first gate driving circuit 120A. The remaining features are disclosed in the description of FIG. 3B and are not repeated herein. The label IN2' (DG/STV3) in FIG. 3D indicates that the input signal IN2' can be the dummy scan signal DG output by the dummy shift register DSR of the first gate driving circuit 120A or the scan control signal STV3 of the second embodiment described below (the relevant descriptions thereof refer to the second embodiment).

Each of the $i^{th}$ stage first shift register LSR(i) and the dummy shift register DSR have 13 transistors (the transistors LM1-LM13), while the $i^{th}$ stage second shift register RSR(i) has 7 transistors (the transistors RM1-RM7). In other words, the number of transistors in each of the $1^{st}$ to $N^{th}$ stage first shift registers LSR(1)-LSR(N) and the dummy shift register DSR is greater than the number of transistors in each of the $1^{st}$ to $N^{th}$ stage second shift registers RSR(1)-RSR(N), and therefore, as described previously, the width W2 of the second shift register in FIG. 2 may be less than the width W1 of the first shift register. In addition, as shown in FIG. 2, the number of signal lines of the second gate driving circuit 120B (the clock signal line ACL, the forward scan signal line RFWL, and the backward scan signal line RBWL, three signal lines in total) is less than the number of signal lines of the first gate driving circuit 120A (the clock signal lines CL1-CL4, the scan control signal lines STVL1 and STVL2, the pull-down control signal lines GPWL1 and GPWL2, the forward scan signal line LFWL, and the backward scan signal line LBWL, ten signal lines in total), and therefore the layout width of the second gate driving circuit 120B may be less than the layout width of the first gate driving circuit 120A. In the embodiment, the $i^{th}$ stage first shift register LSR(i) is coupled to the corresponding scan line $SL_{(2i-1)}$, and the width W1 of the $i^{th}$ stage first-shift register LSR(i) may be the width of the $i^{th}$ stage first shift register LSR(i) in the extending direction of the scan line $SL_{(2i-1)}$ (e.g., the horizontal direction in FIG. 2); the $i^{th}$ stage second shift register RSR(i) is coupled to the corresponding scan line $SL_{(2i)}$, and the width W2 of the $i^{th}$ stage second shift register RSR(i) may be the width of the $i^{th}$ stage second shift register RSR(i) in the extending direction of the scan line $SL_{(2i)}$ (e.g., the horizontal direction in FIG. 2). Similarly, the layout width of the first gate driving circuit 120A and the layout width of the second gate driving circuit 120B may be respectively the layout width of the first gate driving circuit 120A in the extending direction of any scan line SL (e.g., the horizontal direction in FIG. 2) and the layout width of the second gate driving circuit 120B in the extending direction of any scan line SL (e.g., the horizontal direction in FIG. 2).

In FIGS. 3A and 3B, the transistors LM1-LM13 and RM1-RM7 can be amorphous silicon thin-film transistors, low temperature polysilicon (LTPS) thin-film transistors, indium gallium zinc oxide (IGZO) thin-film transistors, or other suitable thin-film transistors. In some embodiments, the transistors LM1-LM13 and RM1-RM7 are n-type thin-film transistors.

In the embodiment of forward scanning, the forward scan signal FW and the backward scan signal BW in the first gate driving circuit 120A and the second gate driving circuit 120B are at the high voltage level and the low voltage level, respectively, such that the scan signals transmitted to the scan lines $SL_1$-$SL_{2N}$ sequentially switch from the low voltage level to the high voltage level and sequentially switch from the high voltage level to the low voltage level (see the waveforms of the $1^{st}$ to $N^{th}$ first scan signals $LG_1$-$LG_N$ and the $1^{st}$ to $N^{th}$ second scan signals $RG_1$-$RG_N$ in FIGS. 5, 8, and 10 and 1 to N levels described below). In the embodiment of the backward scanning, the forward scan signal FW and the backward scan signal BW in the first gate driving circuit 120A and the second gate driving circuit 120B are at the low voltage level and the high voltage level, respectively, such that the scan signals transmitted to the scan line $SL_{2N}$-$SL_1$ sequentially switch from the low voltage level to the high voltage level and sequentially switched from the high voltage level to the low voltage level.

In addition, in the embodiment in which the first gate driving circuit 120A and the second gate driving circuit 120B are unidirectional scan circuits, the first gate driving circuit 120A may be without the forward scan signal line LFWL and the backward scan signal line LBWL, and the second gate driving circuit 120B may be without the forward scan signal line RFWL and the backward scan signal line RBWL. Specifically, in the embodiment in which the first gate driving circuit 120A and the second gate driving circuit 120B are unidirectional scanning circuits, the first terminal of the transistor LM1 of the first gate driving circuit 120A and the first terminal of the transistor RM1 of the second gate driving circuit 120B may be coupled to a voltage source to receive a high voltage, while the first terminal of the transistor LM2 of the first gate driving circuit 120A and the first terminal of the transistor RM2 of the second gate driving circuit 120B may be coupled to a ground line or a gate low voltage signal line to receive a low potential, such that the scan signals transmitted to the scan lines $SL_1$-$SL_{2N}$ sequentially switch from the low voltage level to the high voltage level.

Figure 4:
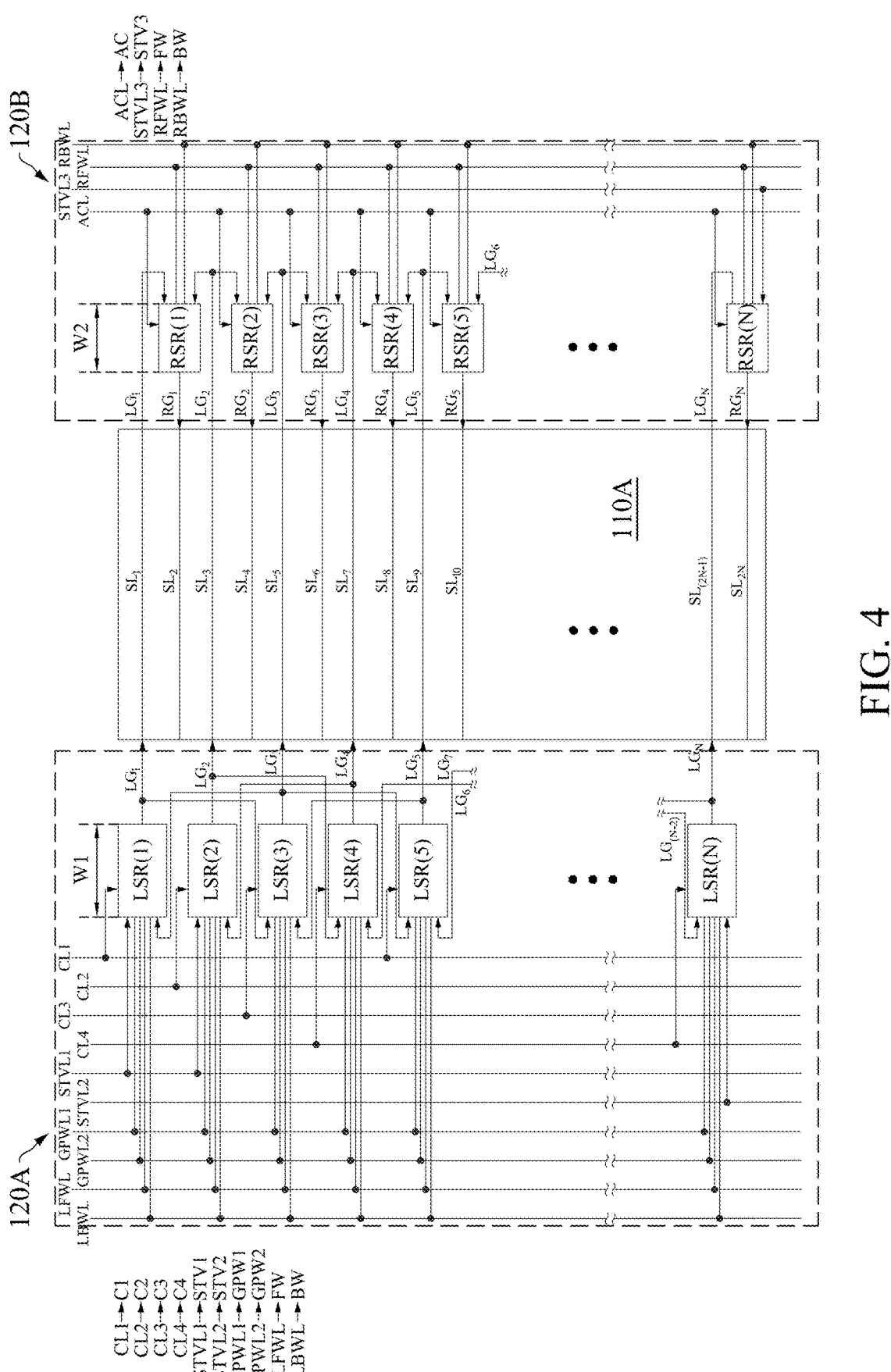
FIG. 4 is a simplified schematic circuit diagram of the active area, the first gate driving circuit, and the second gate driving circuit in FIG. 1 in accordance with the second embodiment of the invention.

FIG. 4 is a simplified schematic circuit diagram of the active area 110A, the first gate driving circuit 120A, and the second gate driving circuit 120B in accordance with the second embodiment of the invention. The differences between FIG. 2 and FIG. 4 are, in FIG. 4, the first gate driving circuit 120A does not include a dummy shift register DSR, and the second gate driving circuit 120B further includes a scan control signal line STVL3 that is coupled to the $N^{th}$ stage second shift register RSR(N) to provide the scan control signal STV3 to the $N^{th}$ stage second shift register RSR(N) as the input signal IN2'. The other features are the same as that shown in FIG. 2 and are not repeated herein.

Figure 5:
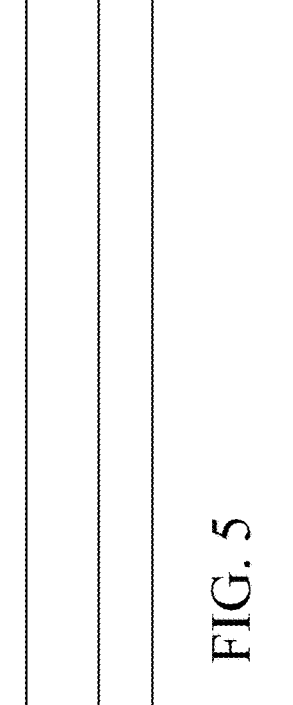
FIG. 5 is a signal timing sequence diagram of the first gate driving circuit and the second gate driving circuit in a frame period corresponding to the first and second embodiments of the invention.

FIG. 5 is a signal timing sequence diagram of the first gate driving circuit 120A and the second gate driving circuit 120B in a frame period corresponding to the first and second embodiments of the invention. FIGS. 6A to 6D illustrate signal flows of each transistor in the second shift register at different times. For convenience of illustration, FIG. 5 only shows a timing sequence change of some signals in the first gate driving circuit 120A and the second gate driving circuit 120B.

As shown in FIG. 5, the clock period of each of the clock signals C1-C4 is 8 times of the unit time H (i.e., 8H). The high-voltage duration and the low-voltage duration of each of the clock signals C1-C4 are 1 unit time (i.e., H) and 7 times of the unit time (i.e., 7H), respectively, and the clock signals C1-C4 generate periodic waveforms in the order of C1, C2, C3, and C4, in which the clock signal C2 is behind the clock signal C1 by ¼ of the clock period (i.e., 2H), the clock signal C3 is behind the clock signal C2 by ¼ of the clock period (i.e., 2H), and the clock signal C4 is behind the clock signal C3 by ¼ of the clock period (i.e., 2H). For example, during the period from the time point T1 to the time point T9, the clock signals C1-C4 rise from the low voltage level to the high voltage level at the time points $T_1$, $T_3$, $T_5$, and $T_7$ in sequence and falls from the high voltage level to the low voltage level at the time points T2, T4, T6, and T8 in sequence. The clock period of the clock signal AC is twice the unit time H (i.e., 2H), and the high-voltage duration and the low-voltage duration of the clock signal AC are both 1 unit time (i.e., H). In the embodiment, the clock signals C1-C4 are low when the clock signal AC is high, and the clock signal AC is low when any of the clock signals C1-C4 is high. For example, during the period from the time point T1 to the time point T9, the high-voltage durations of the clock signal AC are between the time point T2 and the time point T3, between the time point T4 to the time point T5, between the time point T6 to the time point T7, and between the time point T8 to the time point T9. It should be noted that the invention is not limited to the length of the unit time H. In the following paragraphs, the signal sequence diagram of FIG. 5 is described in conjunction with the equivalent circuit diagram of the $i^{th}$ stage first shift register LSR(i) (FIG. 3A), the equivalent circuit diagram of the dummy shift register DSR (FIG. 3B), the equivalent circuit diagram of the $1^{st}$ to $(N-1)^{th}$ stage second shift registers RSR(1)-RSR(N−1) (FIG. 3C), and the equivalent circuit diagram of the $N^{th}$ stage second shift register RSR(N) (FIG. 3D). In addition, FIG. 5 is described subsequently with an embodiment in which the forward scan signal FW and the backward scan signal BW in the first gate driving circuit 120A and the second gate driving circuit 120B are at the high voltage level and the low voltage level, respectively.

Please refer to FIGS. 3A and 5. At the time point $T_0$, the scan control signal STV1 rises from the low voltage level to the high voltage level, such that the transistors LM1 in the $1^{st}$ stage first shift register LSR(1) and the $2^{nd}$ stage first shift register LSR(2) are turned on, and the precharge signal LP(1) in the $1^{st}$ stage first shift register LSR(1) and the precharge signal LP(2) in the $2^{nd}$ stage first shift register LSR(2) rise from the low voltage level to a high voltage level V1 (FIG. 5 only shows the precharge signal LP(1) and omits the precharge signal LP(2)), such that the transistors LM3 in the $1^{st}$ stage first shift register LSR(1) and the $2^{nd}$ stage first shift register LSR(2) are turned on.

Figure 6A:
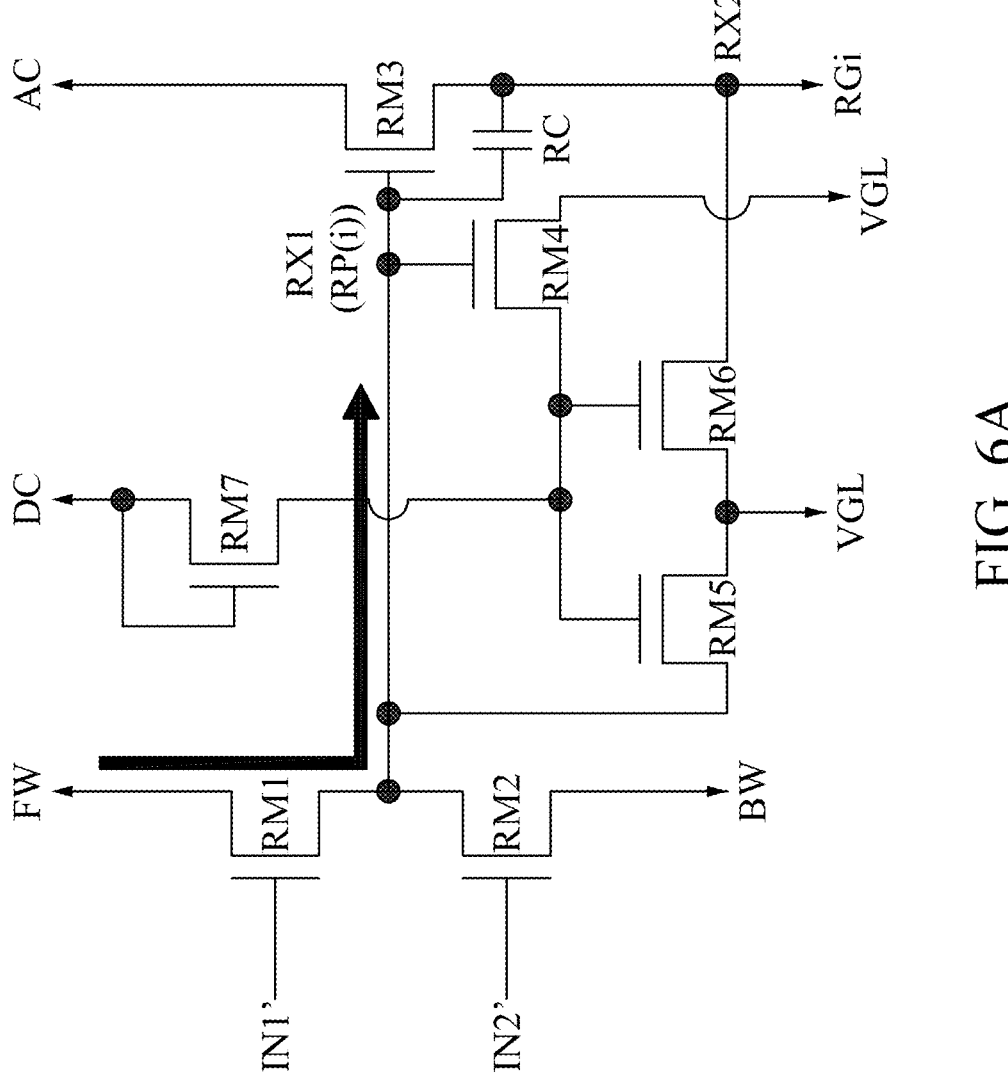
FIGS. 6A to 6D illustrate signal flows of each transistor in the second shift register at different times.

Please refer to FIG. 3A, FIG. 3C, FIG. 5 and FIG. 6A. At the time point $T_1$, the scan control signal STV1 falls from the high voltage level to the low voltage level, and the clock signal C1 rises from the low voltage level to the high voltage level, such that the first scan signal $LG_1$ output by the $1^{st}$ stage first shift register LSR(1) rises from the low voltage level to the high voltage level, and the precharge signal LP(1) in the $1^{st}$ stage first shift register LSR(1) rises from the high voltage level V1 to a high voltage level V2 due to the coupling effect of capacitor LC, in which the high voltage level V2 is greater than the high voltage level V1. In addition, the input signal IN1 of the $3^{rd}$ stage first shift register LSR(3) and the input signal IN1' of the $1^{st}$ stage second shift register RSR(1) are both the $1^{st}$ stage first scan signal $LG_1$ with the high voltage level, and therefore the transistor LM1 in the $3^{rd}$ stage first shift register LSR(3) is turned on for the precharge signal LP(3) to rise from the low voltage level to the high voltage level V1 (FIG. 5 omits the precharge signal LP(3)), and the transistor RM1 in the $1^{st}$ stage second shift register RSR(1) is turned on for the precharge signal RP(1) to rise from the low voltage level to a high voltage level V3 (as shown in FIGS. 5 and 6A, where i in FIG. 6A equals 1), such that the transistors LM3 in the $3^{rd}$ stage first shift register LSR(3) and the $1^{st}$ stage second shift register RSR(1) are both turned on.

Figure 6B:
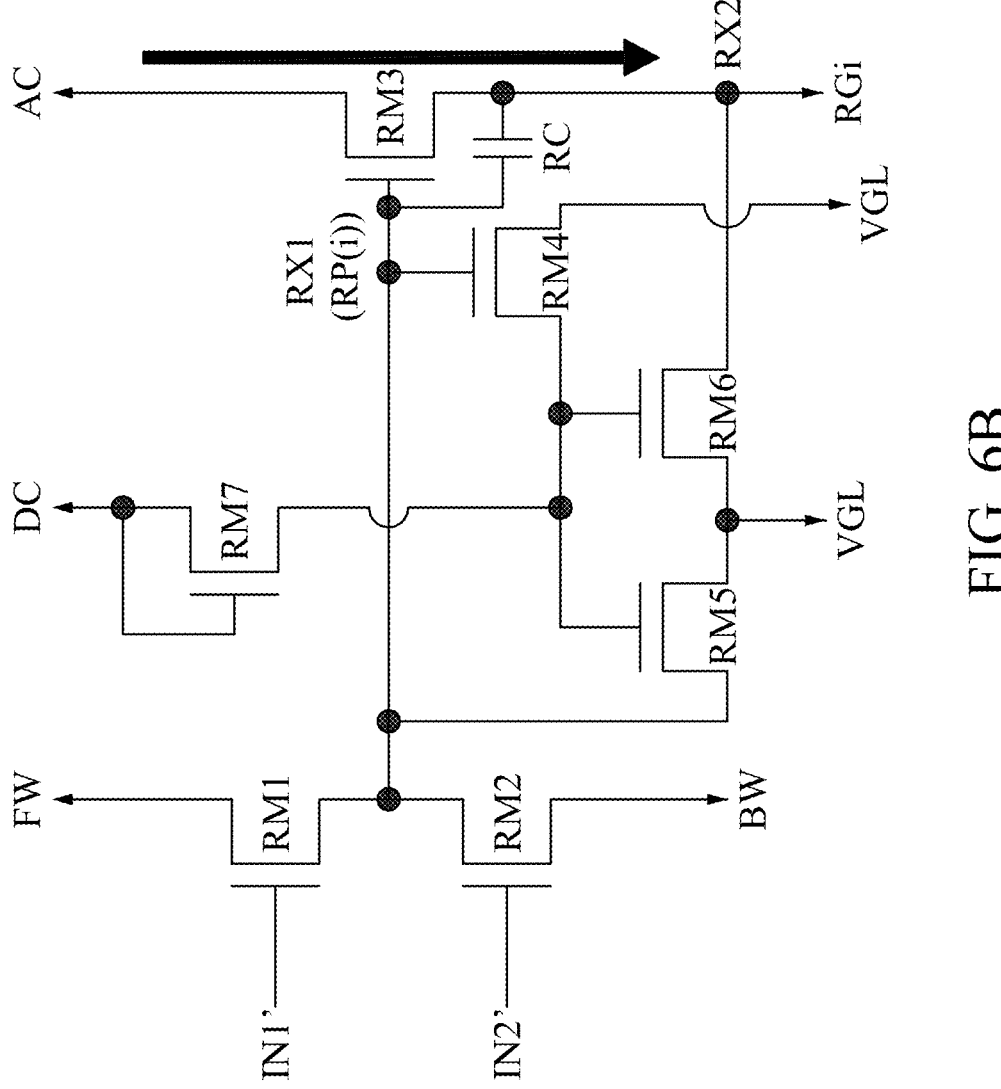

Please refer to FIGS. 3A, 30, 5 and 6B. At the time point $T_2$, the clock signal AC rises from the low voltage level to the high voltage level, and the clock signal C1 falls from the high voltage level to the low voltage level, such that the $1^{st}$ stage first scan signal $LG_1$ output from the $1^{st}$ stage first shift register LSR(1) falls from the high voltage level to the low voltage level, the precharge signal LP(1) in the $1^{st}$ stage first shift register LSR(1) falls from the high voltage level V2 to the high voltage level V1, and the $1^{st}$ stage second scan signal $RG_1$ output by the $1^{st}$ stage second shift register RSR(1) rises from the low voltage level to the high voltage level (as shown in FIGS. 5 and 6B, where i in FIG. 6B equals 1), and the precharge signal RP(1) in the $1^{st}$ stage second shift register RSR(1) rises from the high voltage level V3 to a high voltage level V4 due to the coupling effect of the capacitor RC, in which the high voltage level V4 is greater than the high voltage level V3.

Figure 6C:
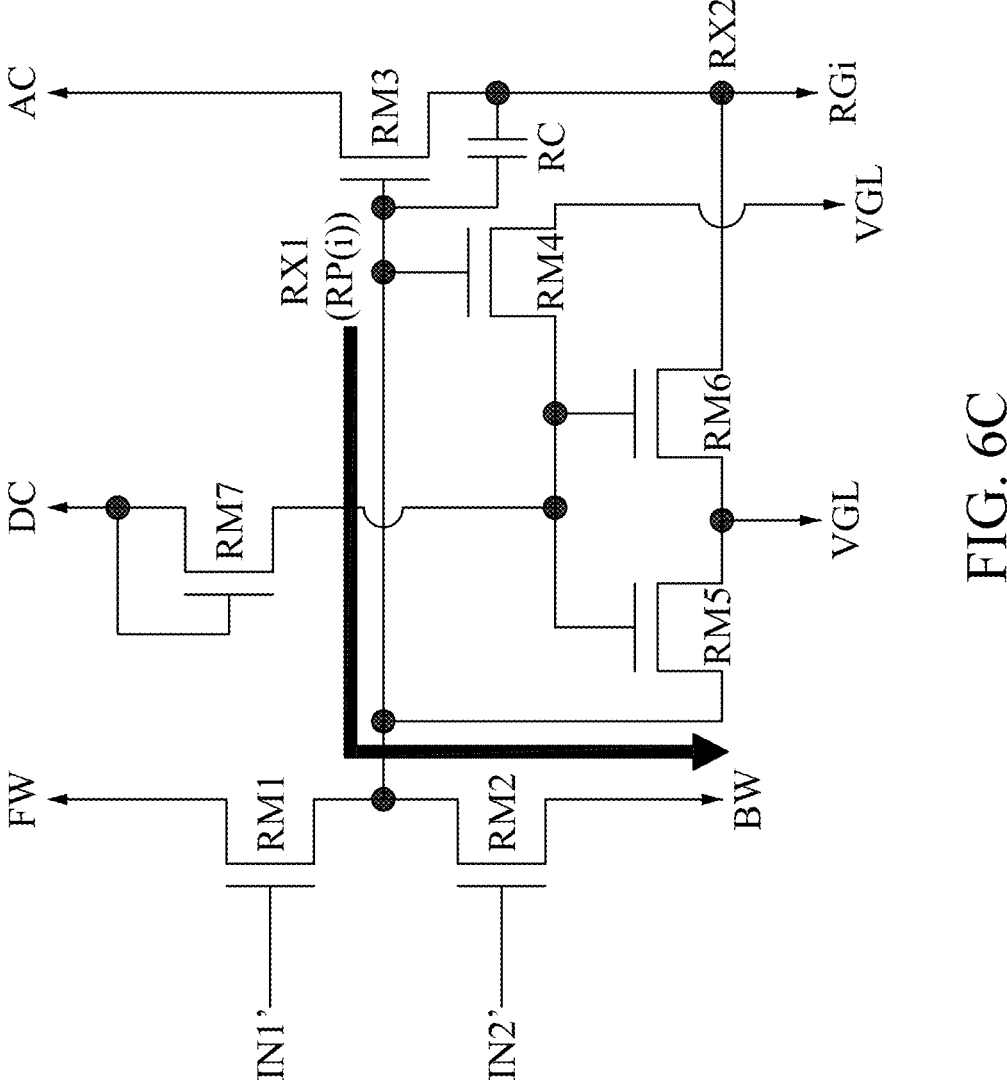

Please refer to FIGS. 3A, 30, 5, 6A, and 6C. At the time point $T_3$, the clock signal AC falls from the high voltage level to the low voltage level, and the clock signal C2 rises from the low voltage level to the high voltage level, such that the $1^{st}$ stage second scan signal $RG_1$ output by the $1^{st}$ stage second shift register RSR(1) falls from the high voltage level to the low voltage level, the $2^{nd}$ stage first scan signal $LG_2$ output by the $2^{nd}$ stage second shift register LSR(2) rises from the low voltage level to the high voltage level, and the precharge signal LP(2) in the $2^{nd}$ stage first shift register LSR(2) rises from the high voltage level V1 to the high voltage level V2 due to the coupling effect of the capacitor LC. The input signal IN2' of the $1^{st}$ stage second shift register RSR(1) is the $2^{nd}$ stage first scan signal $LG_2$, and thus the transistor RM2 of the $1^{st}$ stage second shift register RSR(1) is turned on, such that the precharge signal RP(1) falls from the high voltage level V4 to the low voltage level (as shown in FIGS. 5 and 6C, where i in FIG. 6C equals 1), the transistor RM4 is turned off, and the transistors RM5 and RM6 are turned on. In addition, the input signal IN1 of the $4^{th}$ stage first shift register LSR(4) and the input signal IN1' of the $2^{nd}$ stage second shift register RSR(2) are both the $2^{nd}$ stage first scan signal $LG_2$, such that the transistor LM1 in the $4^{th}$ stage first shift register LSR(4) is turned on for the precharge signal LP(4) to rise from the low voltage level to the high voltage level V1 (the precharge signal LP(4) is omitted in FIG. 5), and the transistor RM1 in the $2^{nd}$ stage second shift register RSR(2) is turned on for the precharge signal RP(2) to rise from the low voltage level to the high voltage level V3 (as shown in FIG. 6A, where i in FIG. 6A equals 2; FIG. 5 omits the waveform of the precharge signal RP(2)), and therefore the transistor LM3 in the $4^{th}$ stage first shift register LSR(4) and the transistor RM3 in the $2^{nd}$ stage second shift register RSR(2) are turned on.

Figure 6D:
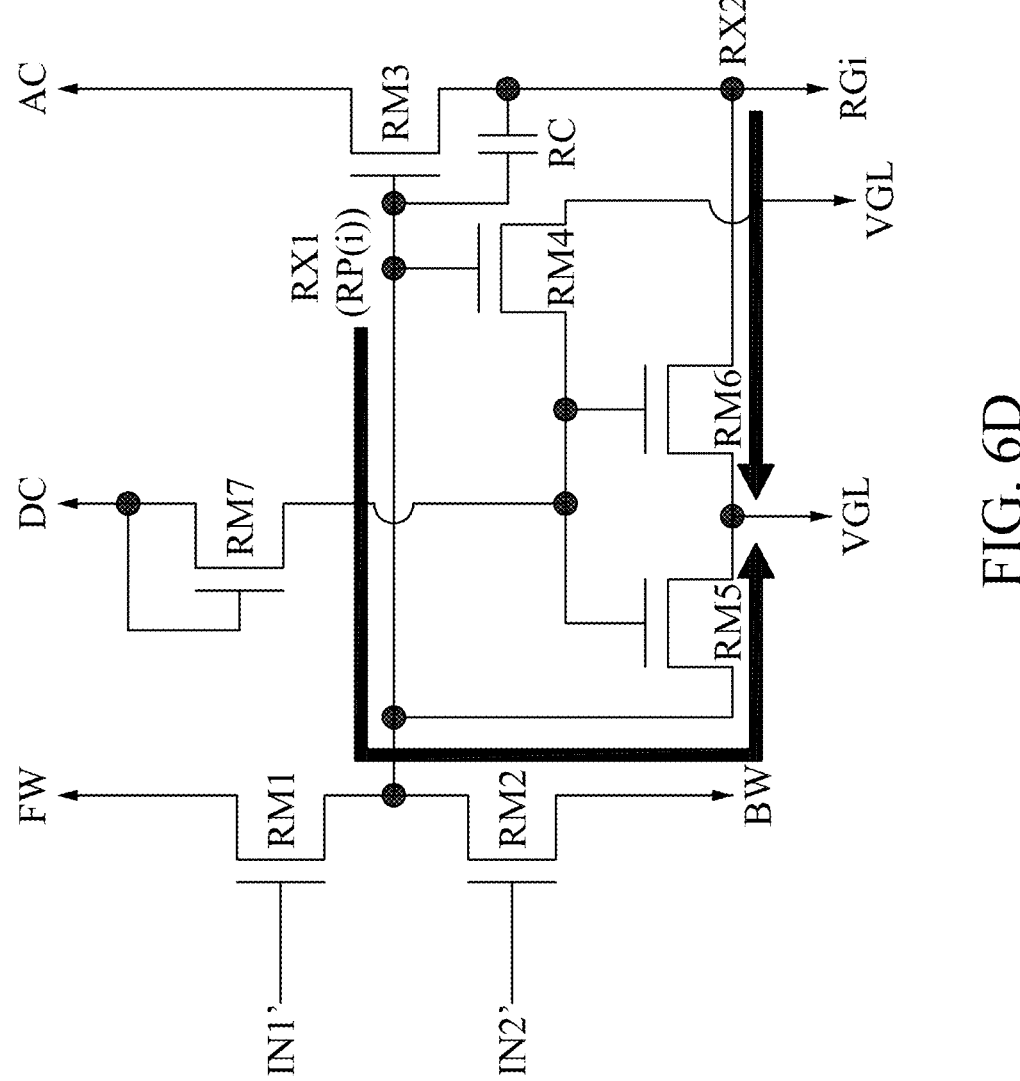

Please refer to FIGS. 3A, 3C, 5, 6B, and 6D. At the time point $T_4$, the clock signal AC rises from the low voltage level to the high voltage level, and the clock signal C2 falls from the high voltage level to the low voltage level, such that the $2^{nd}$ stage first scan signal $LG_2$ output by the $2^{nd}$ stage first shift register LSR(2) falls from the high voltage level to the low voltage level, the precharge signal LP(2) in the $2^{nd}$ stage first shift register LSR(2) falls from the high voltage level V2 to the high voltage level V1, the $2^{nd}$ stage second scan signal $RG_2$ output by the $2^{nd}$ stage second shift register RSR(2) rises from the low voltage level to the high voltage level (as shown in FIG. 6B, where i in FIG. 6B equals 2), and the precharge signal RP(2) in the $2^{nd}$ stage second shift register RSR(2) rises from the high voltage level V3 to the high voltage level V4 due to the coupling effect of the capacitor RC (not shown in FIG. 5). In addition, as shown in FIG. 6D (where i in FIG. 6D equals 1), in the $1^{st}$ stage second shift register RSR(1), the clock signal AC rises to the high voltage level, which probably results in noise being generated at the control terminal (i.e., the node RX1) and the second terminal (i.e., the node RX2) of transistor RM3 through the parasitic capacitor of the transistor RM3. The noise generated at the nodes RX1 and RX2 may be released to the gate low voltage signal VGL through the transistor RM5 and RM6 because the transistor RM4 is turned off and transistors RM5 and RM6 are both turned on.

Please refer to FIGS. 3A, 3C, 5, 6A, and 6C. At the time point T5, the clock signal AC falls from the high voltage level to the low voltage level, and the clock signal C3 rises from the low voltage level to a high voltage, such that the $2^{nd}$ stage second scan signal $RG_2$ output by the $2^{nd}$ stage second shift register RSR(2) falls from the high voltage level to the low voltage level, the $3^{rd}$ stage first scan signal LGs output by the $3^{rd}$ stage first shift register LSR(3) rises from the low voltage level to the high voltage level, and the precharge signal LP(3) in the $3^{rd}$ stage first shift register LSR(3) rises from the high voltage level V1 to the high voltage level V2 (not shown in FIG. 5) due to the coupling effect of the capacitor LC. The input signal IN2 of the $1^{st}$ stage first shift register LSR(1) and the input signal IN2' of the $2^{nd}$ stage second shift register RSR(2) are both the third stage first scan signal $LG_3$, such that the transistor LM2 in the $1^{st}$ stage first shift register LSR(1) is turned on for the precharge signal LP(1) to fall from the high voltage level V1 to the low voltage level, the transistor RM2 in the $2^{nd}$ stage second shift register RSR(2) is turned on for the precharge signal RP(2) to fall from the high voltage level V4 to the low voltage level (as shown in FIG. 6C, where i in FIG. 6C equals 2), the transistor RM4 is turned off, and transistors RM5 and RM6 are turned on. In addition, the input signal IN1 of the $5^{th}$ stage first shift register LSR(5) and the input signal IN1' of the $3^{rd}$ stage second shift register RSR(3) are both the $3^{rd}$ stage first scan signal $LG_3$, such that the transistor LM1 in the $5^{th}$ stage first shift register LSR(5) is turned on for the precharge signal LP(5) to rise from the low voltage level to the high voltage level V1 (not shown in FIG. 5), and the transistor RM1 in the $3^{rd}$ stage second shift register RSR(3) is turned on for the precharge signal RP(3) to rise from the low voltage level to the high voltage level V3 (as shown in FIG. 6A, where i in FIG. 6A equals 3), and thus the transistor LM3 in the $5^{th}$ stage first shift register LSR(5) and the transistor RM3 in the $3^{rd}$ stage second shift register RSR(3) are turned on.

Please refer to FIGS. 3B, 3D, 5, and 6D. At the time point $T_{(2N+1)}$, the clock signal AC falls from the high voltage level to the low voltage level, and the clock signal C1 rises from the low voltage level to the high voltage level, such that the $N^{th}$ stage second scan signal $RG_N$ output by the $N^{th}$ stage second shift register RSR(N) falls from the high voltage level to the low voltage level, and the dummy scan signal DG output by the dummy shift register DSR rises from the low voltage level to the high voltage level, and the precharge signal LP(N+1) in the dummy shift register DSR rises from the high voltage level V1 to the high voltage level V2 due to the coupling effect of the capacitor LC (not shown in FIG. 5). The input signal IN2' of the $N^{th}$ stage second shift register RSR(N) is the dummy scan signal DG, and thus the transistor RM2 in the $N^{th}$ second shift register RSR(N) is turned on for the precharge signal RP(N) to fall from the high voltage level V4 to the low voltage level (not shown in FIG. 5), the transistor RM4 is turned off, and the transistors RM5 and RM6 are turned on.

Please refer to FIGS. 3B and 5. At the time point $T_{(2N+2)}$, the clock signal C1 falls from the high voltage level to the low voltage level, and the scan control signal STV2 rises from the low voltage level to the high voltage level, such that the dummy scan signal DG output from the dummy shift register DSR falls from the high voltage level to the low voltage level, and the transistor LM2 in the dummy shift register DSR is turned on for the precharge signal LP(N+1) to fall from the high voltage level V2 to the low voltage level (not shown in FIG. 5) to finish the display driving on all pixels PX in the active area 110A by the first gate driving circuit 120A and the second gate driving circuit 120B during the frame period.

The description for the signal timing at the time points $T_6$-$T_{(2N)}$ can be derived from the description for the signal timing at the time points $T_0$-$T_5$ and $T_{(2N+1)}$-$T_{(2N+2)}$ described above, and thus is not repeated herein.

As can be seen from the description of FIG. 5, in the same frame period, the $i^{th}$ stage first scan signal $LG_i$ and the $i^{th}$ stage second scan signal $RG_i$ are at high voltage levels respectively in the time intervals from the time point $T_{(2i-1)}$ to the time point $T_{2i}$ and from the time point Tai to the time point $T_{(2i+1)}$, and the dummy scan signal DG is at the high voltage level in the time interval from the time point $T_{(2N+1)}$ to the time point $T_{(2N+2)}$. That is, the $1^{st}$ stage first scan signal $LG_1$ rises to the high voltage level at the time point $T_1$ and remains at the high voltage level for 1 unit time H, then the $1^{st}$ stage second scan signal $RG_1$ rises to the high voltage level at the time point T2 and remains at the high voltage level for 1 unit time H, then the $2^{nd}$ stage first scan signal $LG_2$ rises to the high voltage level at the time point $T_3$ and remains at the high voltage level for 1 unit time H, then the $2^{nd}$ stage second scan signal $RG_2$ rises to the high voltage level at the time point $T_4$ and remains at the high voltage level for 1 unit time H, . . . , then the $N^{th}$ stage second scan signal $RG_N$ rises to the high voltage level at the time point $T_{(2N)}$ and remains at the high voltage level for 1 unit time H, and then the dummy scan signal DG rises to the high voltage level at the time point $T_{(2N+1)}$ and remains at the high voltage level for 1 unit time H. When the $i^{th}$ stage first scan signal $LG_i$ switches from the high voltage level to the low voltage level, the $i^{th}$ stage second scan signal $RG_i$ switches from the low voltage level to the high voltage level, and when the $(i+1)^{th}$ stage first scan signal $LG_{(i+1)}$ switches from the low voltage level to the high voltage level, the $i^{th}$ stage second scan signal $RG_i$ switches from the high voltage level to the low voltage level; when the dummy scan signal DG switches from the low voltage level to the high voltage level, the $N^{th}$ stage second scan signal $RG_N$ switches from the high voltage level to the low voltage level, and thus multiple scan lines SL may be enabled in sequence (i.e., the scan lines $SL_1$, $SL_2$, $SL_3$, $SL_4$, . . . , $SL_{(2N-1)}$, and $SL_{2N}$ are sequentially enabled).

Figure 7:
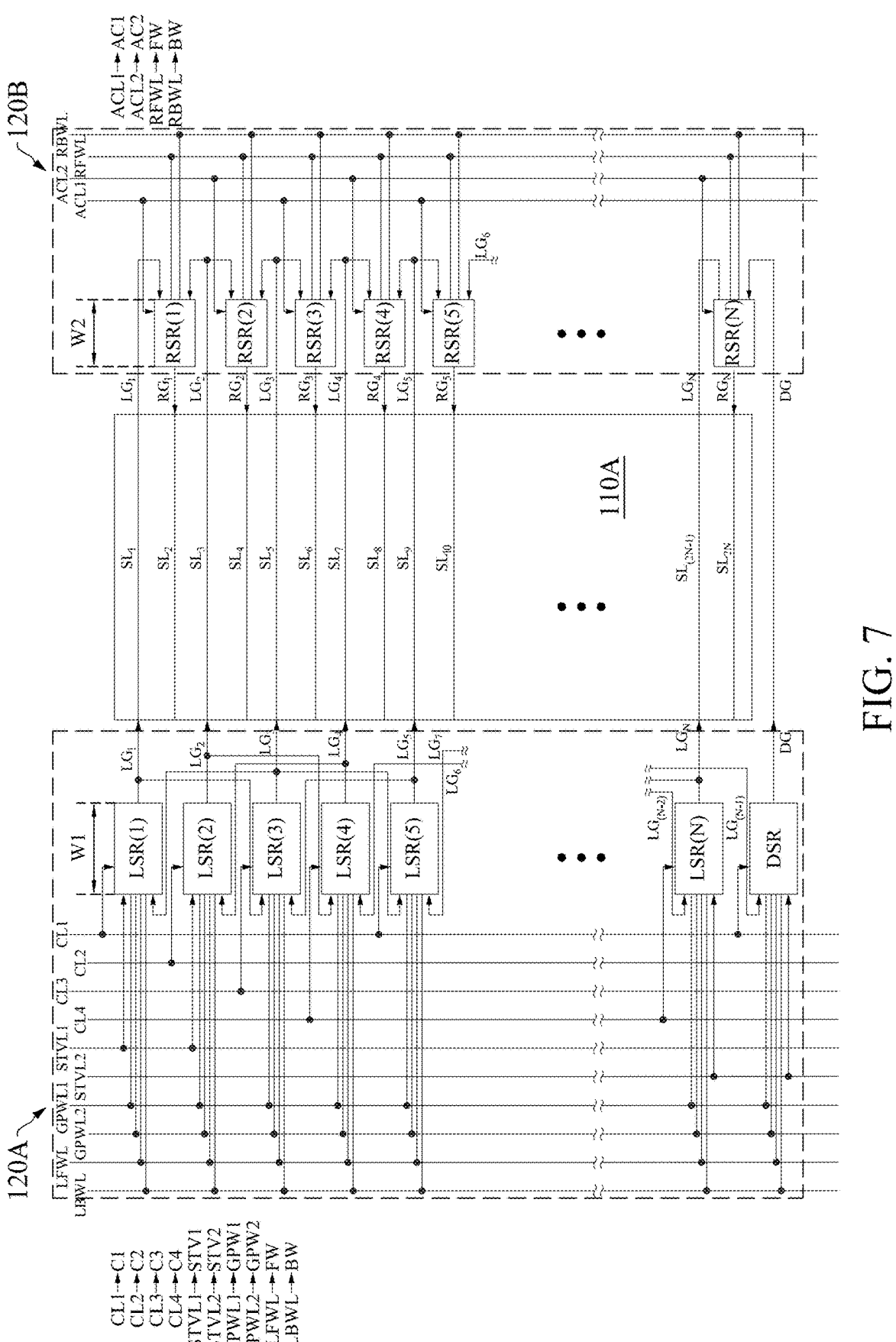
FIG. 7 is a simplified circuit diagram of the active area, the first gate driving circuit, and the second gate driving circuit in FIG. 1 in accordance with a third embodiment of the invention.

FIG. 7 is a simplified circuit diagram of the active area 110A, the first gate driving circuit 120A, and the second gate driving circuit 120B in accordance with a third embodiment of the invention. The difference between FIG. 7 and FIG. 2 is that in FIG. 7, the second gate driving circuit 120B includes two clock signal lines ACL1 and ACL2, in which the clock signal line ACL1 is coupled to the odd-numbered stage second shift registers (i.e., the $1^{st}$ stage second shift register RSR(1), the $3^{rd}$ stage second shift register RSR(3), . . . , and the $(N-1)^{th}$ stage second shift register RSR(N-1)) to provide the clock signal AC1 to odd-numbered stage second shift registers, while the clock signal line ACL2 is coupled to even-numbered stage second shift registers (i.e., the $2^{nd}$ stage second shift register RSR(2), the $4^{th}$ stage second shift register RSR(4), . . . , and the $N^{th}$ stage second shift register RSR(N)) to provide the clock signal AC2 to the even-numbered stage second shift register. Specifically, the clock signal line ACL1 is coupled to the first terminal of the transistor RM3 in each odd-numbered stage second shift register, and the clock signal line ACL2 is coupled to the first terminal of the transistor RM3 in each even-numbered stage second shift register. The remaining parts are the same as that shown in FIG. 2 and thus are not repeated herein. The equivalent circuit diagram of the $1^{st}$ to $N^{th}$ stage second shift registers RSR(1)-RSR(N) of the second gate driving circuit 120B in FIG. 7 may be similar to those shown in FIG. 3C and FIG. 3D, with the difference being that in this embodiment, the odd-numbered stage second shift registers receive the clock signal AC1 and the even-numbered stage second shift register receive the clock signal AC2.

Figure 8:
FIG. 8 is a signal timing sequence diagram of the first gate driving circuit and the second gate driving circuit in a frame period corresponding to the third embodiment.

FIG. 8 is a signal timing sequence diagram of the first gate driving circuit 120A and the second gate driving circuit 120B in a frame period corresponding to the third embodiment. For convenience of illustration, FIG. 8 only shows a time sequence change of some signals in the first gate driving circuit 120A and the second gate driving circuit 120B. The differences between the signal timing sequence diagrams shown in FIG. 8 and FIG. 5 are that in FIG. 8, the clock period of each of the clock signals AC1 and AC2 is 4 times of the unit time H (i.e., 4H), in which the high-voltage duration and low-voltage duration of each of the clock signals AC1 and AC2 are respectively ¼ and ¾ of the clock period (i.e., H and 3H, respectively), and the clock signal AC2 is behind the clock signal AC1 by ½ of the clock period (i.e. 2H), and thus the high-voltage durations of the clock signal AC1 is not overlapped with the high-voltage duration of the clock signal AC2. In the embodiment, when any of the clock signals AC1 and AC2 is at the high voltage level, the clock signals C1-C4 are at the low voltage level, and when any of the clock signals C1-C4 is at the high voltage level, the clock signals AC1 and AC2 are at the low voltage level. The clock signal AC1 rises to the high voltage level at the time points $T_2$, $T_6$, . . . , $T_{(2N-2)}$, such that the odd-numbered stage second scan signals (i.e., the $1^{st}$ stage second scan signal $RG_1$, the $3^{rd}$ stage second scan signal $RG_3$, . . . , and the $(N-1)^{th}$ stage second scan signal RG (N-1) output by the odd-numbered stage second shift registers (i.e., the $1^{st}$ stage second shift register RSR(1), the $3^{rd}$ stage second shift register RSR(3), . . . , and the $(N-1)^{th}$ stage second shift register RSR(N-1)) rise from the low voltage level to the high voltage level at the time points $T_2$, $T_6$, . . . , $T_{(2N-2)}$, respectively. The clock signal AC2 rises to the high voltage level at the time points $T_4$, $T_8$, . . . , $T_{(2N)}$, such that the even-numbered stage second scan signals (i.e., the $2^{nd}$ stage second scan signal $RG_2$, the $4^{th}$ stage second scan signal $RG_4$, . . . , and the $N^{th}$ stage second scan signal $RG_N$) output by the even-numbered stage second shift registers (i.e., the $2^{nd}$ stage second shift register RSR(2), the $4^{th}$ stage second shift register RSR(4), . . . , and the $N^{th}$ stage second shift register RSR(N)) rise from the low voltage level to the high voltage level at the time points $T_4$, $T_8$, . . . , $T_{(2N)}$, respectively. The timing diagram of the remaining signals is the same as that of the same signal in FIG. 5 and thus is not repeated herein. In addition, in the embodiment, the second gate driving circuit 120B receives two clock signals AC1 and AC2 that are interleaved with each other, and the low-voltage duration of each of the clock signals AC1 and AC2 is ¾ of the clock period. Therefore, in comparison with the first embodiment in which a clock signal AC is received, the low-voltage duration of the clock signal AC is ½ of the clock period, the input signal IN1' of the $i^{th}$ stage second shift register RSR(i) can be the $i^{th}$ stage first scan signal $LG_i$, and the input signal IN2' of the $i^{th}$ stage second shift register RSR(i) can be the $(i+1)^{th}$ stage first scan signal $LG_{(i+1)}$ or the dummy scan signal DG, in the embodiment, the input signal IN1' of the $i^{th}$ stage second shift register RSR(i) can be the $i^{th}$ stage first scan signal $LG_i$ or the $(i-1)^{th}$ stage first scan signal $LG_{(i-1)}$, and the input signal IN2' of the $i^{th}$ stage second shift register RSR(i) can be the $(i+1)^{th}$ stage first scan signal $LG_{(i+1)}$, the $(i+2)^{th}$ stage first scan signal $LG_{(i+2)}$, or the dummy scan signal DG.

Figure 9:
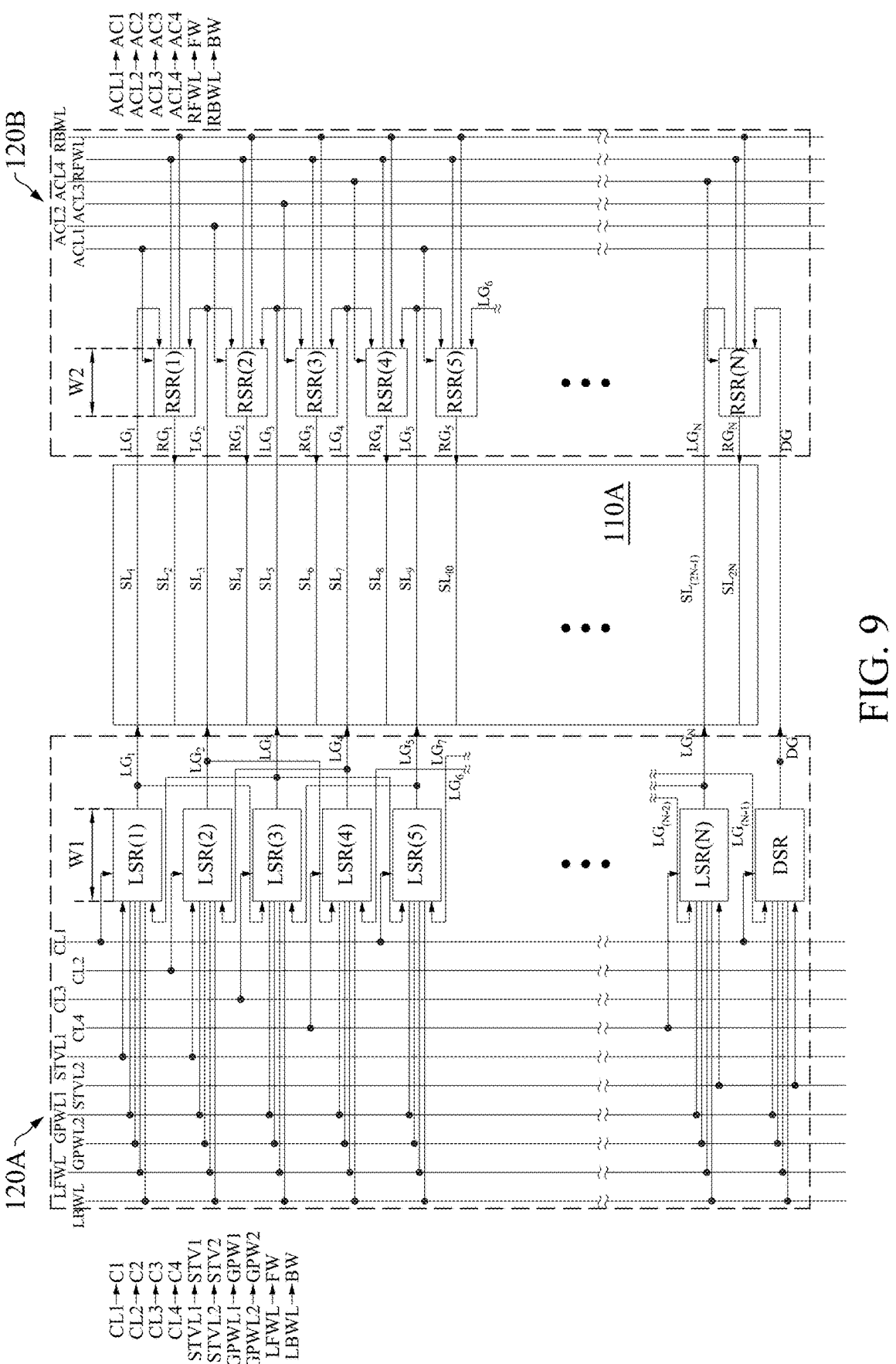
FIG. 9 is a simplified circuit diagram of the active area, the first gate driving circuit, and the second gate driving circuit in FIG. 1 in accordance with a fourth embodiment of the invention.

FIG. 9 is a simplified circuit diagram of the active area 110A, the first gate driving circuit 120A, and the second gate driving circuit 120B in accordance with a fourth embodiment of the invention. The differences between FIG. 9 and FIG. 2 are that in FIG. 9, the second gate driving circuit 120B includes four hour signal lines ACL1-ACL4, in which the time clock signal ACL1 is coupled to the $(4K-3)^{th}$ stage second shift registers, where K is a positive integer greater than or equal to 1 (i.e., the $1^{st}$ stage second shift register RSR(1), the $5^{th}$ stage second shift register RSR(5), . . . , and the $(N-3)^{th}$ stage second shift register RSR(N-3)), so as to provide the clock signal AC1 to the $(4K-3)^{th}$ second shift registers; the clock signal line ACL2 is coupled to the $(4K-2)^{th}$ stage second shift registers (i.e., the $2^{nd}$ stage second shift register RSR(2), the $6^{th}$ stage second shift register RSR(6), . . . , and the $(N-2)^{th}$ stage second shift registers RSR(N-2)), so as to provide the clock signal AC2 to the $(4K-2)^{th}$ stage second shift registers; the clock signal line ACL3 is coupled to the $(4K-1)^{th}$ stage second shift registers (i.e., the $3^{rd}$ stage second shift register RSR(3), the $7^{th}$ stage second shift register RSR(7), . . . , and the $(N-1)^{th}$ stage second shift registers RSR(N-1)), so as to provide the clock signal AC3 to the $(4K-1)^{th}$ stage second shift registers; the clock signal line ACL4 is coupled to the $(4K)^{th}$ stage second shift registers (i.e., the $4^{th}$ stage second shift register RSR(4), the $8^{th}$ stage second shift register RSR(8), . . . , and the $N^{th}$ stage second shift register RSR(N), so as to provide the clock signal AC4 to the $(4K)^{th}$ stage second shift registers. Specifically, the clock signal line ACL1 is coupled to the first terminal of the transistor RM3 in the $(4K-3)^{th}$ stage second shift register, the clock signal line ACL2 is coupled to the first terminal of the transistor RM3 in the $(4K-2)^{th}$ stage second shift register, the clock signal line ACL3 is coupled to the first terminal of the transistor RM3 in the $(4K-1)^{th}$ stage second shift register, and the clock signal line ACL4 is coupled to the first terminal of the transistor RM3 in the $(4K)^{th}$ stage second shift register. The remaining parts are the same as that shown in FIG. 2 and thus are not repeated herein. The equivalent circuit diagram of the $1^{st}$ to $N^{th}$ stage second shift registers RSR(1)-RSR(N) of the second gate driving circuit 120B in FIG. 9 may be similar to those shown in FIG. 3C and FIG. 3D, with the difference that in this embodiment, the $(4K-3)^{th}$ stage second shift registers receive the clock signal AC1, the $(4K-2)^{th}$ stage second shift registers receive the clock signal AC2, the $(4K-1)^{th}$ stage second shift registers receive the clock signal AC3, and the $(4K)^{th}$ stage second shift registers receive the clock signal AC4.

Figure 10:
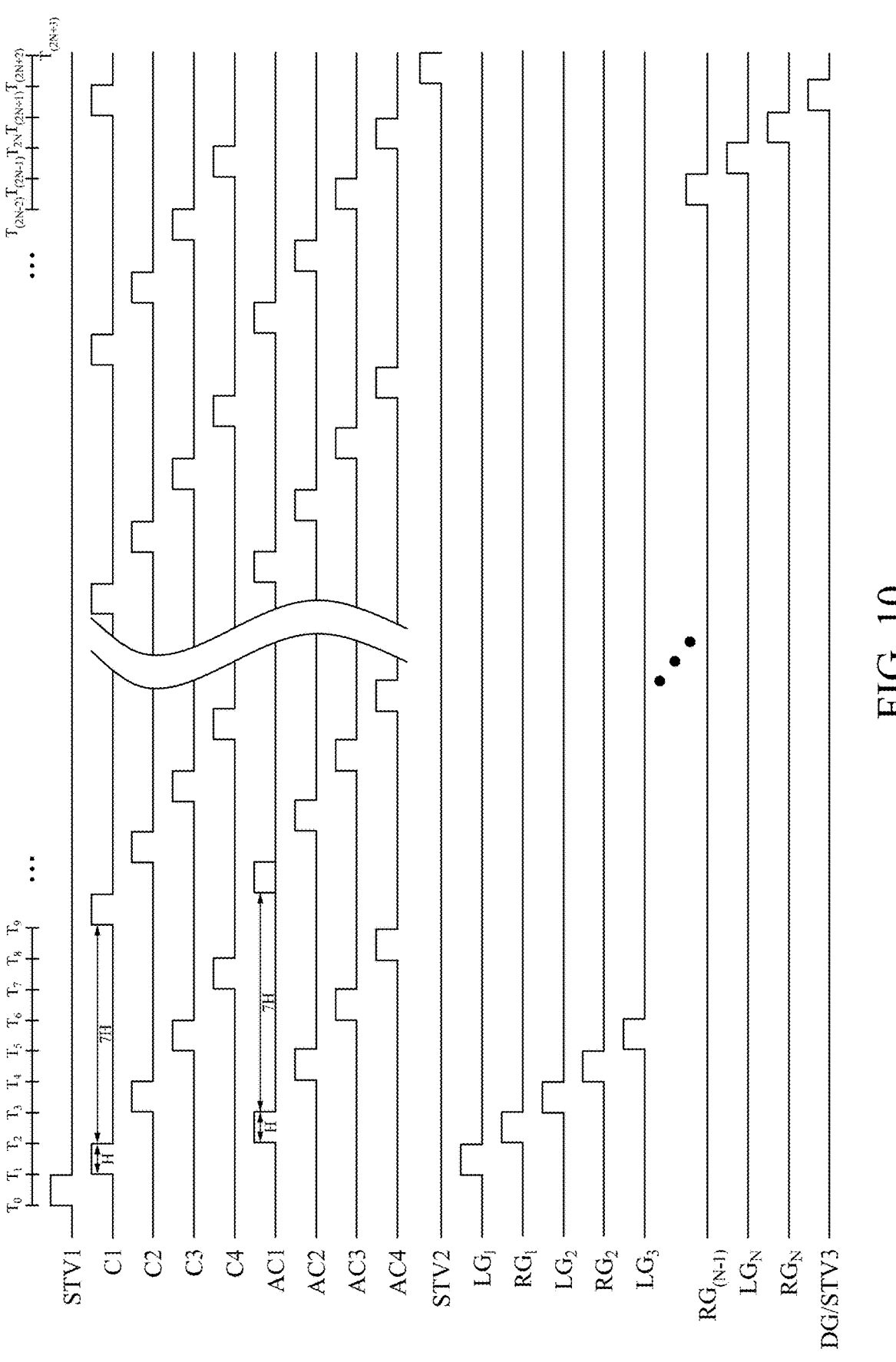
FIG. 10 is a signal timing sequence diagram of the first gate driving circuit and the second gate driving circuit in a frame period corresponding to the fourth embodiment.

FIG. 10 is a signal timing sequence diagram of the first gate driving circuit 120A and the second gate driving circuit 120B in a frame period corresponding to the fourth embodiment. For convenience of illustration, FIG. 10 only shows a time sequence change of some signals in the first gate driving circuit 120A and the second gate driving circuit 120B. The differences between the signal timing sequence diagrams shown in FIG. 10 and FIG. 5 are that in FIG. 10, the clock period of the clock signals AC1-AC4 is 8 times of the unit time H (i.e., 8H), in which the high-voltage duration and low-voltage duration of each of the clock signals AC1-AC4 are respectively ⅛ and ⅞ of the clock period (i.e., H and 7H, respectively). The clock signals AC1 and AC2 differ by ¼ of the clock period, and the clock signal AC2 is behind the clock signal AC1 by ¼ of the clock period (i.e., 2H); the clock signals AC2 and AC3 differ by ¼ of the clock cycles, and the clock signal AC3 is behind the clock signal AC2 by ¼ of the clock period (i.e., 2H), the clock signals AC3 and AC4 differ by ¼ of the clock period, and the clock signal AC4 is behind the clock signal AC3 by ¼ of the clock period (i.e., 2H), and thus the high-voltage duration of the clock signals AC1, AC2, AC3, and AC4 are not overlapped with each other. In the embodiment, when any one of the clock signals AC1, AC2, AC3, and AC4 is at a high-voltage level, the clock signals C1-C4 are at a low-voltage level, and when any of the clock signals C1-C4 is at a high-voltage level, the clock signals AC1, AC2, AC3, and AC4 are at the low voltage level. The clock signal AC1 rises to the high voltage level at the time points $T_2$, $T_{10}$, . . . , and $T_{(2N-6)}$, such that the $(4K-3)^{th}$ stage second scan signals (i.e., the $1^{st}$ stage second scan signal $RG_1$, the $5^{th}$ stage second scan signal $RG_5$, . . . , and the $(N-3)^{th}$ stage second scan signal $RG_{(N-3)}$) output by the $(4K-3)^{th}$ stage second shift registers (i.e., the $1^{st}$ stage second shift register RSR(1), the $5^{th}$ stage second shift register RSR(5), . . . , and the $(N-3)^{th}$ stage second shift register RSR(N-3)) rise from the low voltage level to the high voltage level at the time points $T_2$, $T_{10}$, . . . , and $T_{(2N-6)}$, respectively. The clock signal AC2 rises to the high voltage level at the time points $T_4$, $T_{12}$, . . . , and $T_{(2N-4)}$, such that the $(4K-2)^{th}$ stage second scan signals (i.e., the $2^{nd}$ stage second scan signal $RG_2$, the $6^{th}$ stage second scan signal $RG_6$, . . . , and the $(N-2)^{th}$ stage second scan signal $RG_{(N-2)}$) output by the $(4K-2)^{th}$ stage second shift registers (i.e., the $2^{nd}$ stage second shift register RSR(2), the $6^{th}$ stage second shift register RSR(6), . . . , and the $(N-2)^{th}$ stage second shift register RSR(N-2)) rise from the low voltage level to the high voltage level at the time points $T_4$, $T_{12}$, . . . , and $T_{(2N-4)}$, respectively. The clock signal AC3 rises to the high voltage level at the time points $T_6$, $T_{14}$, . . . , and $T_{(2N-2)}$, such that the $(4K-1)^{th}$ stage second scan signals (i.e., the $3^{rd}$ stage second scan signal $RG_3$, the $7^{th}$ stage second scan signal $RG_7$, . . . , and the $(N-1)^{th}$ stage second scan signal $RG_{(N-1)}$) output by the $(4K-1)^{th}$ stage second shift registers (i.e., the $3^{rd}$ stage second shift register RSR(3), the $7^{th}$ stage second shift register RSR(7), . . . , and the $(N-1)^{th}$ stage second shift register RSR(N-1)) rise from the low voltage level to the high voltage level at the time points $T_6$, $T_{14}$, . . . , and $T_{(2N-2)}$, respectively. The clock signal AC4 rises to the high voltage level at the time points $T_8$, $T_{16}$, . . . , and $T_{(2N)}$, such that the $(4K)^{th}$ stage second scan signals (i.e., the $4^{th}$ stage second scan signal $RG_4$, the $8^{th}$ stage second scan signal $RG_8$, . . . , and the $N^{th}$ stage second scan signal $RG_N$) output by the $(4K)^{th}$ stage second shift registers (i.e., the $4^{th}$ stage second shift register RSR(4), the $8^{th}$ stage second shift register RSR(8), . . . , and the $N^{th}$ stage second shift register RSR(N)) rise from the low voltage level to the high voltage level at the time points $T_8$, $T_{16}$, . . . , and $T_{(2N)}$, respectively. The timing diagram of the remaining signals is the same as that of the same signal in FIG. 5 and thus is not repeated herein. In addition, in the embodiment, the second gate driving circuit 120B receives four clock signals AC1, AC2, AC3, and AC4 that are interleaved with each other, and the low-voltage duration of each of the clock signal AC1, AC2, AC3, and AC4 is ⅞ of the clock period. Therefore, in comparison with the first embodiment in which a clock signal AC is received, the low-voltage duration of the clock signal AC is ½ of the clock period, the input signal IN1' of the $i^{th}$ stage second shift register RSR(i) can be the $i^{th}$ stage first scan signal $LG_i$, and the input signal IN2' of the $i^{th}$ stage second shift register RSR(i) can be the $(i+1)^{th}$ stage first scan signal $LG_{(i+1)}$ or the dummy scan signal DG, in the embodiment, the input signal IN1' of the $i^{th}$ stage second shift register RSR(i) can be the $i^{th}$ stage first scan signal $LG_i$, the $(i-1)^{th}$ stage first scan signal $LG_{(i-1)}$, the $(i-2)^{th}$ stage first scan signal $LG_{(i-2)}$, or the $(i-3)^{th}$ stage first scan signal $LG_{(i-3)}$, and the input signal IN2' of the $i^{th}$ stage second shift register RSR(i) can be the $(i+1)^{th}$ stage first scan signal $LG_{(i+1)}$, the $(i+2)^{th}$ stage first scan signal $LG_{(i+2)}$, the $(i+3)^{th}$ stage first scan signal $LG_{(i+3)}$, the $(i+4)^{th}$ stage first scan signal $LG_{(i+4)}$, or the dummy scan signal DG.

It is noted that the third and fourth embodiments are illustrated by, but are not limited to, using the dummy scan signal DG output by the dummy shift register DSR as the input signal IN2' of the $N^{th}$ stage second shift register RSR(N). In one embodiment variant from the third and fourth embodiments, the first gate driving circuit 120A does not include a dummy shift register DSR, and the second gate driving circuit 120B further includes a scan control signal line (such as the scan control signal line STVL3 of the second embodiment) that is coupled to the $N^{th}$ stage second shift register RSR(N) to provide a scan control signal (such as the scan control signal STV3 of the second embodiment) to the $N^{th}$ stage second shift register RSR(N) as the input signal IN2' of the $N^{th}$ stage second shift register RSR(N). The remaining features are the same as those shown in FIG. 7 and FIG. 9 and are not repeated herein.

Figure 11A:
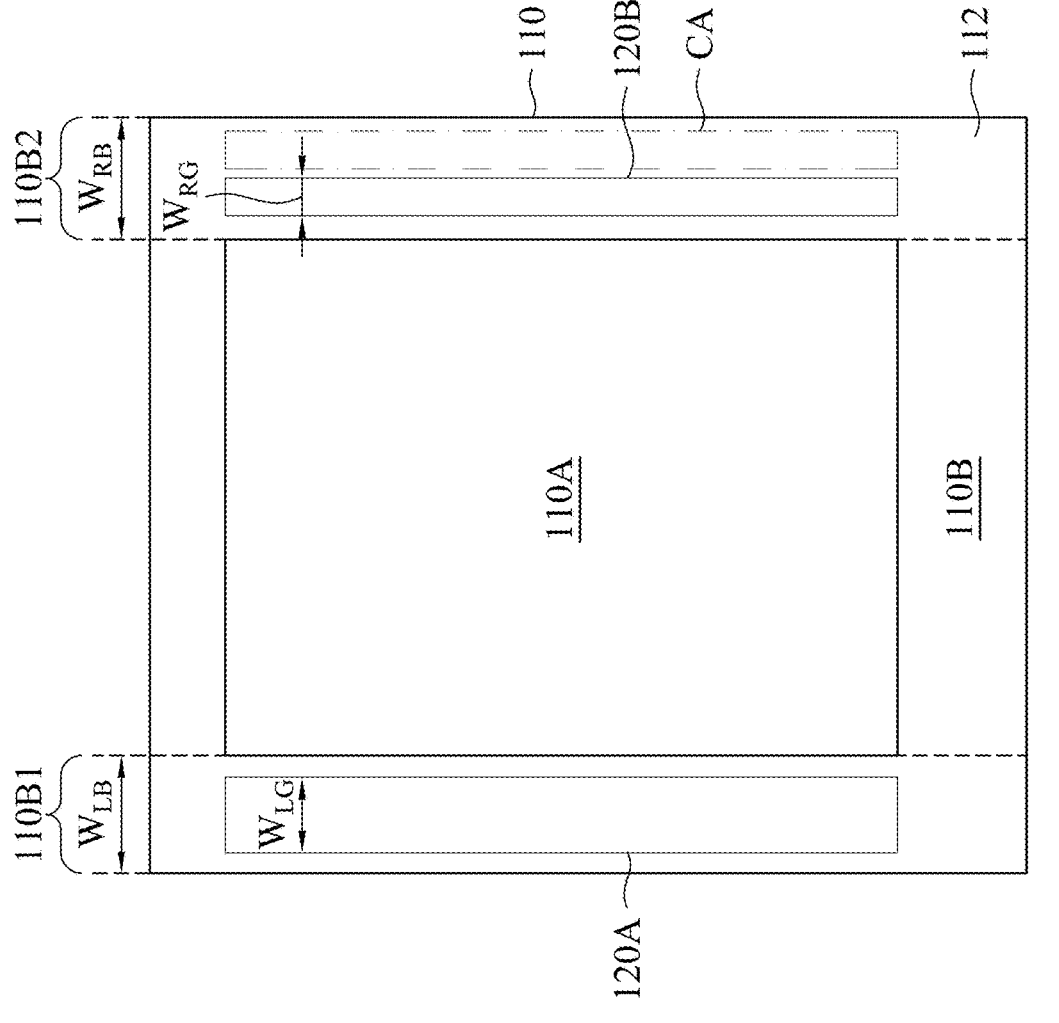
FIG. 11A is a schematic diagram of the configuration of the active area and the peripheral area in the display panel in FIG. 1.

FIG. 11A is a schematic diagram showing the configuration of the active area 110A and the peripheral area 110B in the display panel 110. In FIG. 11A, the peripheral area 110B includes sub-peripheral areas 110B1 and 110B2 that are located outside the opposite two sides of the active area 110A, respectively, and the first gate driving circuit 120A and the second gate driving circuit 120B are respectively arranged in the sub-peripheral areas 110B1 and 110B2. The sub-peripheral areas 110B1 and 110B2 respectively have border widths $W_{LB}$ and $W_{RB}$, and the border width $W_{LB}$ is substantially equal to the border width $W_{RB}$. In addition, the first gate driving circuit 120A and the second gate driving circuit 120B respectively have layout widths $W_{LG}$ and $W_{RG}$. As shown in FIGS. 2, 4, 7, and 9, the number of signal lines in the first gate driving circuit 120A is greater than the number of signal lines in the second gate driving circuit 120B, and the width W1 of each of the $1^{st}$ to $N^{th}$ stage first shift registers LSR(1)-LSR(N) of the levels is greater than the width W2 of each of the $1^{st}$ to $N^{th}$ second shift registers RSR(1)-RSR(N) (the number of transistors in each of the $1^{st}$ to $N^{th}$ stage first shift registers LSR(1)-LSR(N) is greater than the number of transistors in each of the $1^{st}$ to $N^{th}$ second shift registers RSR(1)-RSR(N)), and therefore the layout width $W_{LG}$ is greater than the layout width $W_{RG}$. Therefore, the sub-peripheral area 110B2 has an additional circuit layout space CA to dispose other circuits (e.g., electrostatic discharge protection circuits, test circuits, or other circuits that can be disposed on the active array substrate 112).

Figure 11B:
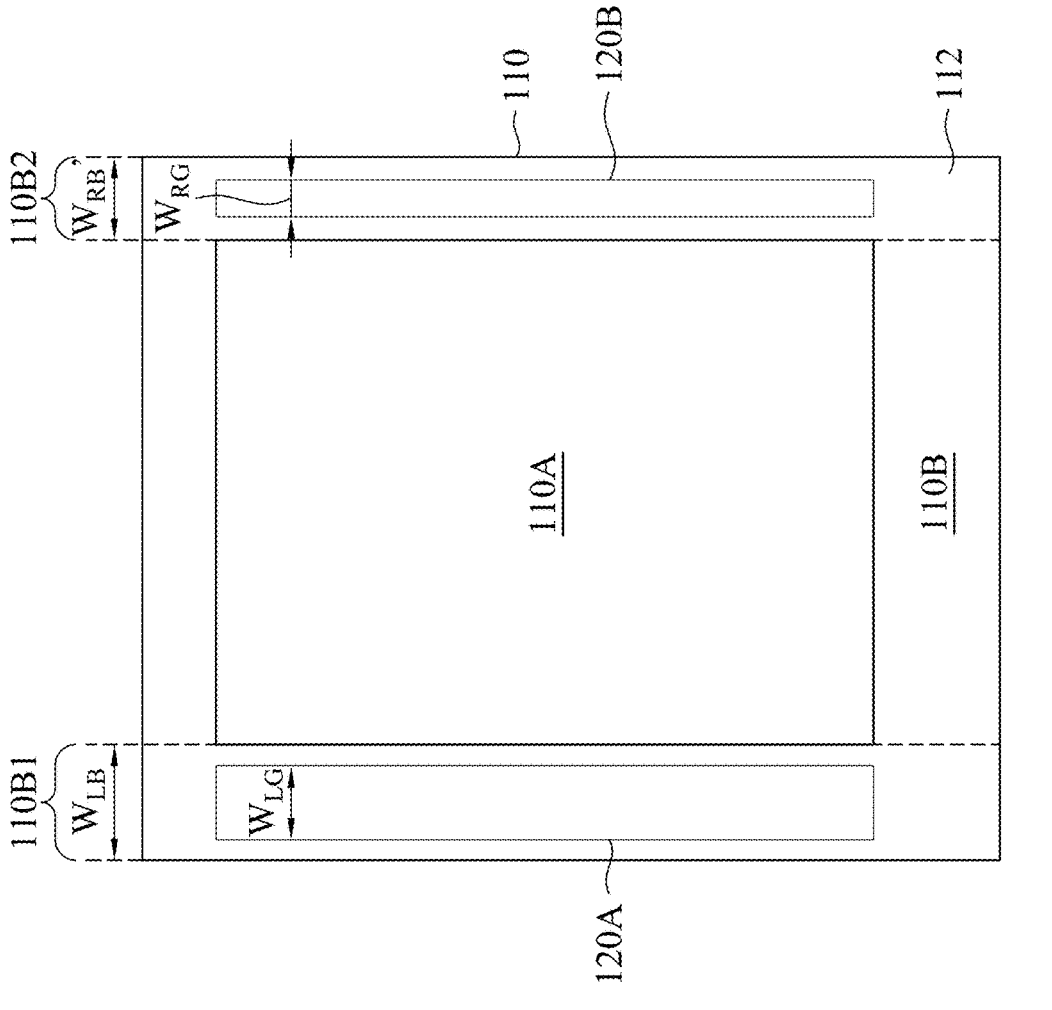
FIG. 11B is another schematic diagram of the configuration of the active area and the peripheral area in the display panel in FIG. 1.

FIG. 11B is another schematic diagram showing the configuration of the active area 110A and the peripheral area 110B in the display panel 110. In FIG. 11B, the peripheral area 110B includes sub-peripheral areas 110B1 and 110B2 that are located on opposite sides of the active area 110A, respectively. The sub-peripheral areas 110B1 and 110B2 respectively have border widths $W_{LB}$ and $W_{RB}'$. The difference between FIG. 11B and FIG. 11A is that in FIG. 11B, the border width $W_{RB}'$ of the sub-peripheral area 110B2 is smaller than the border width $W_{LB}$ of the sub-peripheral area 110B1, i.e., the widths of the sub-peripheral areas 110B1 and 110B2 located on opposite sides of the active area 110A are asymmetrical. For example, multiple display panels 110 in the embodiment can be spliced together to form a splicing screen, in which the sub-peripheral area 110B2 of one of the adjacent two display panels 110 and the sub-peripheral area 110B1 of the other of the adjacent two display panels 110 are spliced with each other, but the invention is not limited thereto. The remaining features in FIG. 11B are the same as that shown in FIG. 11A and are not repeated herein.

As can be seen from the above description, by utilizing the special design for the gate driving circuit, the invention can reduce the border width of the display device and/or increase the layout area of the other circuits in the display device and can effectively reduce power consumption.

What is claimed is:

1. A display device, comprising:

a display panel having an active area and a peripheral area and comprising a plurality of scan lines in the active area, wherein the plurality of scan lines are arranged in a first direction, each of the plurality of scan lines extends in a second direction, the peripheral area comprises a first sub-peripheral area and a second sub-peripheral area that are respectively outside two opposite sides of the active area along the second direction, the plurality of scan lines comprise N number of first scan lines and N number of second scan lines, and the first scan lines and the second scan lines are alternately arranged along the first direction, where N is an integer greater than or equal to 4; and a gate driving circuit located in the peripheral area and configured to drive the scan lines of the display panel, the gate driving circuit comprising:

a first gate driving circuit located in the first sub-peripheral area and comprising $1^{st}$ to $N^{th}$ stage first shift registers that are configured to respectively output $1^{st}$ to $N^{th}$ stage first scan signals to the first scan lines; and a second gate driving circuit located in the second sub-peripheral area and comprising $1^{st}$ to $N^{th}$ stage second shift registers that are configured to respectively output $1^{st}$ to $N^{th}$ stage second scan signals to second scan lines;

wherein each of the $1^{st}$ to $N^{th}$ stage first shift registers and the $1^{st}$ to $N^{th}$ stage second shift registers includes a precharge unit and a pull-up unit, the first scan lines are coupled with the pull-up units of the $1^{st}$ to $N^{th}$ stage first shift registers and the precharge units of the $1^{st}$ to $N^{th}$ stage second shift registers, the second scan lines are coupled with the pull-up units of the $1^{st}$ to $N^{th}$ stage second shift registers and not coupled with the $1^{st}$ to $N^{th}$ stage first shift registers, and the $1^{st}$ to $N^{th}$ stage first scan signals output by the pull-up units of the $1^{st}$ to $N^{th}$ stage first shift registers are further transmitted to the precharge units of the $1^{st}$ to $N^{th}$ stage second shift registers as a plurality of first input signals of the $1^{st}$ to $N^{th}$ stage second shift registers through the first scan lines, wherein the number of transistors in each of the $1^{st}$ to $N^{th}$ stage second shift registers is less than the number of transistors in each of the $1^{st}$ to $N^{th}$ stage first shift registers.

2. The display device of claim 1, wherein each of the $1^{st}$ to $N^{th}$ stage first shift registers has a first width in the second direction, each of the $1^{st}$ to $N^{th}$ stage second shift registers has a second width in the second direction, and the first width is greater than the second width.

3. The display device of claim 2, wherein the first sub-peripheral area has a first border width in the second direction, the second sub-peripheral area has a second border width in the second direction, and the first border width is greater than the second border width.

4. The display device of claim 1, wherein each of the $1^{st}$ to $N^{th}$ stage second shift registers is configured to receive a corresponding one of the first input signals, and the first input signal of an $i^{th}$ stage second shift register of the $1^{st}$ to $N^{th}$ stage second shift registers is a corresponding one of the $1^{st}$ to $N^{th}$ stage first scan signals, where i is an integer greater than or equal to 1 and less than or equal to N.

5. The display device of claim 4, wherein each of the $1^{st}$ to $N^{th}$ stage second shift registers is configured to further receive a second input signal, the second input signal of a $j^{th}$ stage second shift register of the $1^{st}$ to $(N-1)^{th}$ stage second shift registers is a corresponding one of the $1^{st}$ to $N^{th}$ stage first scan signals, where j is an integer greater than or equal to 1 and less than or equal to $(N-1)$.

6. The display device of claim 5, wherein the first gate driving circuit further comprises a dummy shift register that is configured to receive one of the $1^{st}$ to $N^{th}$ stage first scan signals and output a dummy scan signal, and wherein the second input signal of the $N^{th}$ stage second shift register is the dummy scan signal.

7. The display device of claim 5, wherein the second gate driving circuit further comprises a scan control signal line that is coupled to the $N^{th}$ stage second shift register, and wherein the second input signal of the $N^{th}$ stage second shift register is a scan control signal that is provided by the scan control signal line.

8. The display device of claim 1, wherein the second gate driving circuit further comprises at least one clock signal line, and wherein an $i^{th}$ stage second shift register of the $1^{st}$ to $N^{-th}$ stage second shift registers comprises:

a first transistor, wherein a first terminal of the first transistor is configured to receive a first voltage signal, a second terminal of the first transistor is coupled to a first node, and a control terminal of the first transistor is configured to receive a first input signal;

a second transistor, wherein a first terminal of the second transistor is configured to receive a second voltage signal, a second terminal of the second transistor is coupled to the first node, and a control terminal of the second transistor is configured to receive a second input signal; and a third transistor, wherein a first terminal of the third transistor is configured to receive a clock signal that is provided by one of the at least one clock signal line, a second terminal of the third transistor is coupled to a second node and is configured to output an $i^{th}$ stage second scan signal of the $1^{st}$ to $N^{th}$ stage second scan signals, and a control terminal of the second transistor is coupled to the first node, where i is an integer greater than or equal to 1 and less than or equal to N.

9. The display device of claim 8, wherein the $i^{th}$ stage second shift register further comprises:

a fourth transistor, wherein a first terminal of the fourth transistor is configured to receive a first reference voltage, and a control terminal of the fourth transistor is coupled to the first node;

a fifth transistor, wherein a first terminal of the fifth transistor is configured to receive the first reference voltage, a second terminal of the fifth transistor is coupled to the first node, and a control terminal of the fifth transistor is coupled to a second terminal of the fourth transistor;

a sixth transistor, wherein a first terminal of the sixth transistor is configured to receive the first reference voltage, a second terminal of the sixth transistor is coupled to the second node, and a control terminal of the sixth transistor is coupled to the second terminal of the fourth transistor; and a seventh transistor, wherein a first terminal and a control terminal of the seventh transistor is configured to receive a second reference voltage, and a second terminal of the seventh transistor is coupled to the second terminal of the fourth transistor, and the second reference voltage is greater than the first reference voltage.

\* \* \* \* \*